(12) United States Patent
Chien

(10) Patent No.: US 12,047,074 B2
(45) Date of Patent: Jul. 23, 2024

(54) DRIVING CIRCUIT

(71) Applicant: HIMAX TECHNOLOGIES LIMITED, Tainan (TW)

(72) Inventor: Chia-Chu Chien, Tainan (TW)

(73) Assignee: HIMAX TECHNOLOGIES LIMITED, Tainan (TW)

(*) Notice: Subject to any disclaimer, the term of this patent is extended or adjusted under 35 U.S.C. 154(b) by 0 days.

(21) Appl. No.: 18/063,063

(22) Filed: Dec. 7, 2022

(65) Prior Publication Data

US 2023/0370051 A1  Nov. 16, 2023

(30) Foreign Application Priority Data

May 10, 2022 (TW) .................................. 111117535

(51) Int. Cl.
*H03K 3/012* (2006.01)
*H03K 17/687* (2006.01)

(52) U.S. Cl.
CPC ......... *H03K 3/012* (2013.01); *H03K 17/6872* (2013.01)

(58) Field of Classification Search
CPC .......................... H03K 3/012; H03K 17/6872
See application file for complete search history.

(56) References Cited

U.S. PATENT DOCUMENTS

| | | | |
|---|---|---|---|
| 2013/0241910 A1* | 9/2013 | Huang | G09G 3/3696 345/87 |
| 2019/0079326 A1 | 3/2019 | Hao et al. | |
| 2019/0088220 A1* | 3/2019 | Cheng | G09G 3/3688 |
| 2019/0164512 A1* | 5/2019 | Saitoh | G09G 3/20 |
| 2019/0340994 A1* | 11/2019 | Chen | G09G 3/3688 |

FOREIGN PATENT DOCUMENTS

| | | |
|---|---|---|
| CN | 108198538 A | 6/2018 |
| CN | 109903714 A | 6/2019 |
| CN | 112017613 A | 12/2020 |
| TW | 201517007 A | 5/2015 |

* cited by examiner

*Primary Examiner* — Sibin Chen
(74) *Attorney, Agent, or Firm* — CKC & Partners Co., LLC

(57) ABSTRACT

A driving circuit is provided, including first to second output stage circuits that output, respectively, first and second voltages of a first polarity. The driving circuit further includes a first switch having a first terminal receiving the first voltage from the first output stage circuit and a second terminal coupled to a first output channel through a switching circuit, and a second switch having a first terminal receiving the second voltage from the second output stage circuit and a second terminal coupled to a second output channel through the switching circuit. The driving circuit further includes a first charge sharing circuit having a first terminal coupled to the first output channel and a second terminal coupled to the second output channel. The first charge sharing circuit is turned on to provide charge sharing between the first output channel and the second output channel.

7 Claims, 30 Drawing Sheets

FIG. 9A

Timing diagram showing signal states across time intervals $T_1$ through $T_9$, with CHOP Output at $T_1$, HI-Z Interval spanning $T_2$–$T_8$, and CHOP Output at $T_9$.

positive polarity path:

| Signal | CHOP Output ($T_1$) | HI-Z Interval ($T_2$–$T_8$) | CHOP Output ($T_9$) |
|---|---|---|---|
| P1 PMOS gate | VDDAH | | H |
| P1 NMOS gate | H | | VDDAH |
| NH1 NMOS gate | VDDAH | | H |
| P4 PMOS gate | VDDAH | | H |
| P4 NMOS gate | H | | VDDAH |
| NH3 NMOS gate | VDDAH | | H |
| B1 NMOS gate | H | | L |
| B1 NMOS bulk | H | | L |
| B2 PMOS gate | | | VDDAH |
| B2 PMOS bulk | H | | VDDAH |
| B5 NMOS gate | H | | L |
| B5 NMOS bulk | H | | L |
| B5 PMOS gate | | | VDDAH |
| B5 PMOS bulk | H | | VDDAH |
| B3 PMOS gate | H | | L |
| B3 PMOS bulk | H | | VDDAH |
| B3 NMOS gate | | | VDDAH |
| B3 NMOS bulk | H | | L |
| B4 PMOS gate | L | | H |
| B4 PMOS bulk | VDDAH | | H |
| B4 NMOS gate | | | VDDAH |
| B4 NMOS bulk | L | | H |
| B6 PMOS gate | H | | L |
| B6 PMOS bulk | H | | VDDAH |
| B6 NMOS gate | | | VDDAH |
| B6 NMOS bulk | VDDAH | | L |
| PH3 PMOS gate | L | | VDDAH |
| N4 PMOS gate | H | | VDDAH |
| N4 NMOS gate | VDDAH | | H |
| NH2 NMOS gate | H | | VDDAH |
| P3 PMOS gate | H | | VDDAH |
| P3 NMOS gate | VDDAH | | H |

FIG. 9B

DRIVING CIRCUIT

RELATED APPLICATIONS

This application claims priority to Taiwan Application Serial Number 111117535, filed on May 10, 2022, which is herein incorporated by reference in its entirety.

BACKGROUND

Description of Related Art

In some approaches, to protect the transistors in the charge sharing circuit from damage caused by voltage crossing thereon when the polarity is reversed, the output channels are coupled to multiple transistors. However, such configurations cause the signal to pass through multiple switches during charge sharing, which increases power consumption and reduces circuit operation speed.

SUMMARY

One embodiment of the present disclosure is related to a driving circuit, including first to second output stage circuit that output, respectively, a first voltage of a first polarity and a second voltage, different from the first voltage, of the first polarity. The driving circuit further includes a first switch having a first terminal receiving the first voltage from the first output stage circuit and a second terminal coupled to a first output channel through a switching circuit and a second switch having a first terminal receiving the second voltage from the second output stage circuit and a second terminal coupled to a second output channel through the switching circuit. The driving circuit further includes a first charge sharing circuit having a first terminal coupled to the first output channel and a second terminal coupled to the second output channel. The first charge sharing circuit is turned on to provide charge sharing between the first output channel and the second output channel.

One embodiment of the present disclosure is related to a driving circuit, including a first charge sharing circuit and a second charge sharing circuit. The first charge sharing circuit is coupled to a first output channel, a second output channel and a third output channel, and is selectively turned on to provide charge sharing between the first output channel to the third output channel. The first output channel to the third output channel correspond to odd-numbered output channels of the driving circuit. The second charge sharing circuit includes a first switch coupled between the first output channel and a fourth output channel and a second switch coupled between the fourth output channel and the third output channel. The second charge sharing circuit is selectively turned on to provide charge sharing between the first output channel, the third output channel and the fourth output channel.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9A to 9B are schematic diagrams of control signals in the driving circuit correspondingly as shown in FIG. 8, in accordance with an embodiment of the present disclosure.

DETAILED DESCRIPTION

The spirit of the present disclosure will be discussed in the following drawings and detailed description, and those of ordinary skill in the art will be able to change and modify the teachings of the present disclosure without departing from the spirit and scope of the present disclosure.

It should be understood that, in this document and the following claims, when an element is referred to as being "connected" or "coupled" to another element, it can be directly connected or coupled to another element, or there may be an intervening component. In contrast, when an element is referred to as being "directly connected" or "directly coupled" to another element, there is no intervening element. In addition, "electrically connected" or "connected" may also be configured to indicate that two or more elements cooperate or interact with each other.

It should be understood that, in this document and the following claims, the terms "first" and "second" are to describe the various elements. However, these elements should not be limited by these terms. These terms are configured to distinguish one element from another. For example, a first element may be termed a second element. Similarly, a second element may be termed a first element without departing from the spirit and scope of the embodiments.

It should be understood that, in this document and the following claims, the terms "include," "comprise," "having" and "has/have" are used in an open-ended fashion, and thus should be interpreted to mean "include, but not limited to."

It should be understood that, in this document and the following claims, the term "and/or" includes any and all combinations of one or more of the associated listed items.

It should be understood that, in this document and the following claims, unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 1:
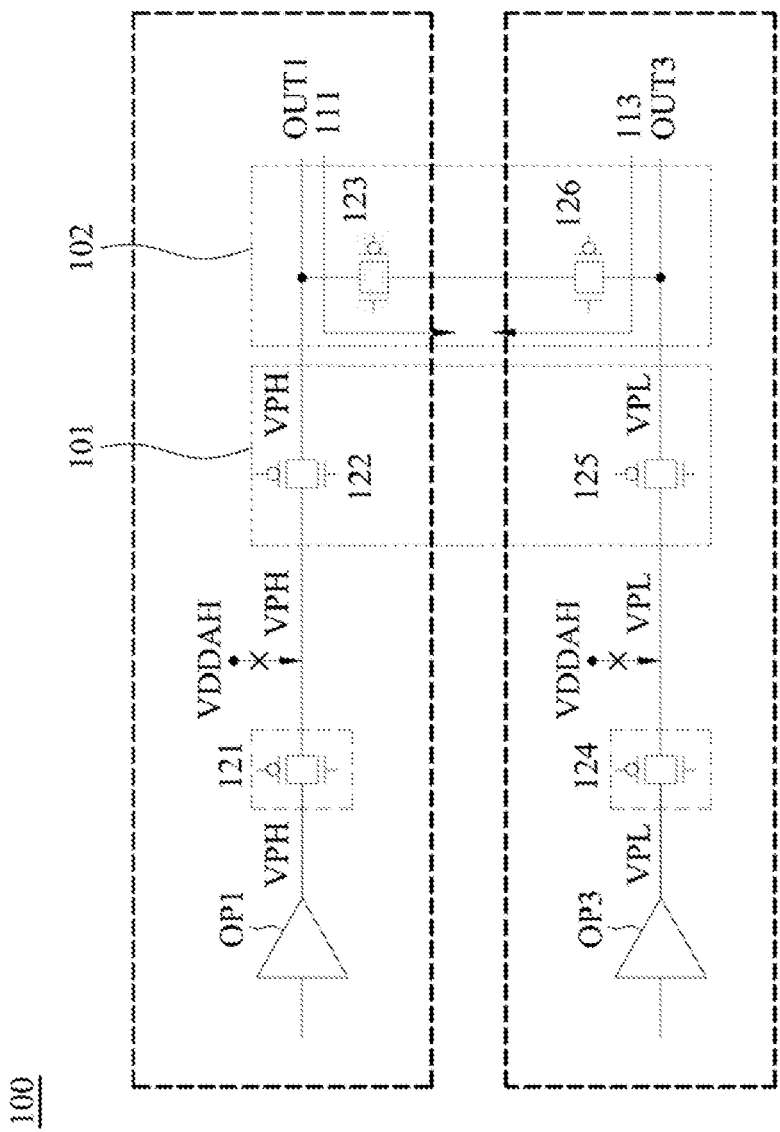
FIG. 1 is a schematic diagram of a driving circuit, in accordance an embodiment of the present disclosure.

Reference is now made to FIG. 1. FIG. 1 is a schematic diagram of a driving circuit 100, in accordance with an embodiment of the present disclosure. As shown in FIG. 1, the driving circuit 100 includes output stage circuits OP1 and OP3, switches 121 and 124, a switching circuit 101 and a charge sharing circuit 102. The switching circuit 101 includes switching switches 122 and 125. In FIG. 1, the switching switch 122 has a first terminal receiving the voltage VPH from the output stage circuit OP1 and a second terminal coupled to the output channel OUT1; the switch 125 has a first terminal receiving the voltage VPL from the output stage circuit OP3 and a second terminal coupled the output channel OUT3. The charge sharing circuit 102 has a first terminal coupled to the output channel OUT1 and a second terminal coupled to the output channel OUT3. In some embodiments, the charge sharing circuit 102 further includes switches 123 and 126.

In some embodiments, when the charge sharing circuit 102 is turned off, the output stage circuit OP1 is configured to output the voltage VPH, and the output stage circuit OP3 is configured to output the voltage VPL. In some embodiments, the voltage VPH corresponds to the higher voltage of the first polarity (e.g., referred to as positive polarity and corresponding to an operating voltage interval of the driving circuit 100) of the driving circuit 100, and the voltage VPL corresponds to the lower voltage of the first polarity of the driving circuit 100. For example, in some embodiments, the circuit elements of the driving circuit 100 shown in FIG. 1 operate in one of the operating voltage ranges of the driving circuit 100, and the operating voltage range is about 6 Volts to 12 Volts. Therefore, the output stage circuit OP1 outputs the voltage VPH of about 12 Volts to the output channel OUT1 by turning on the switch 121 and the switching switch 122, and the output stage circuit OP3 outputs the voltage VPL of about 6 Volts to the output channel OUT3 by turning on the switch 124 and the switching switch 125.

Figure 3:
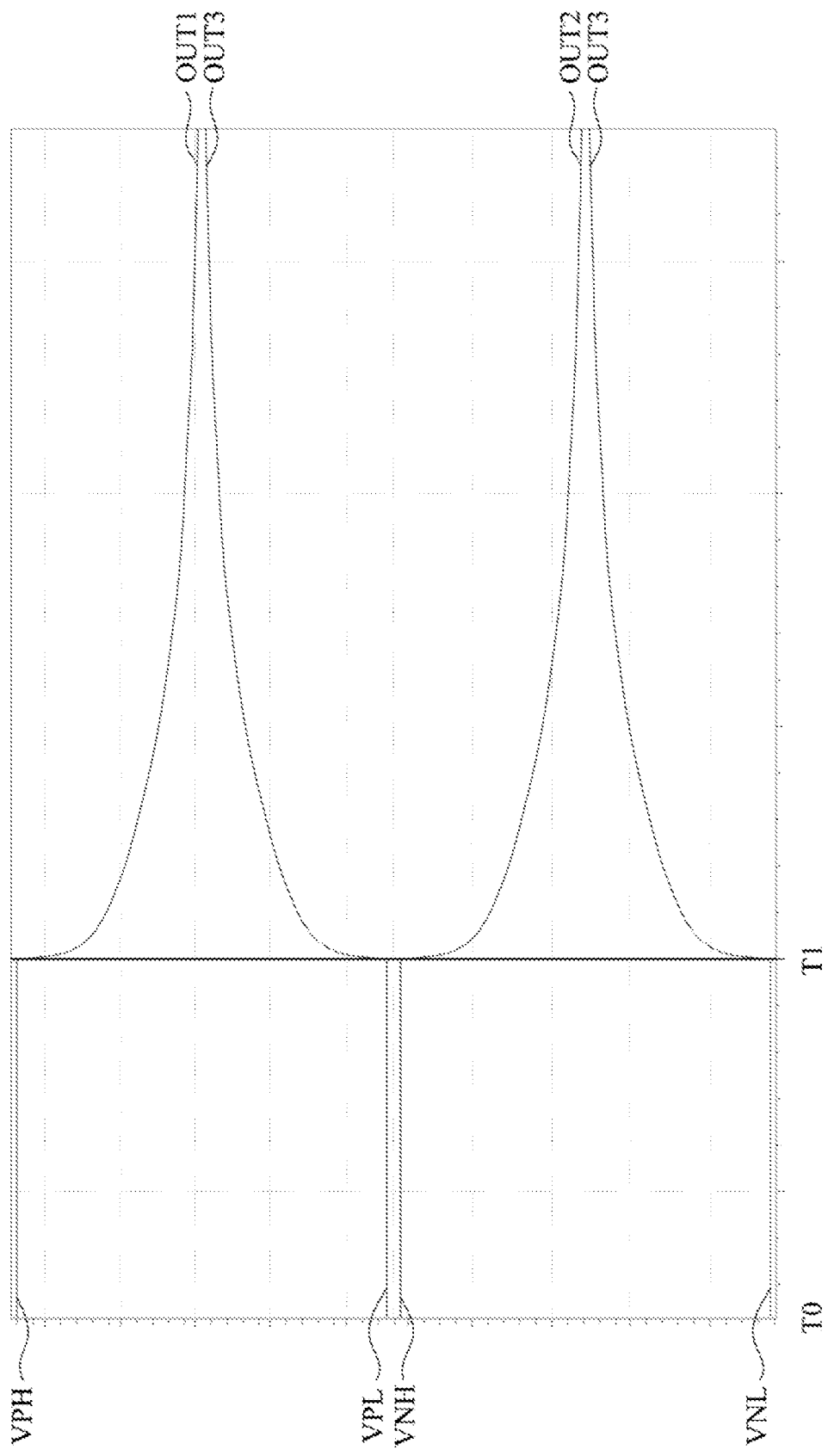
FIG. 3 is a waveform diagram of output signals of a driving circuit, in accordance with an embodiment of the present disclosure.

In some embodiments, when the switches 121 and 124 are turned off, the charge sharing circuit 102 is configured to be turned on to provide charge sharing between the output channels OUT1 and OUT3, as shown by the charge sharing paths 111 and 113. Reference is now made to FIG. 3. FIG. 3 is a waveform diagram of output signals of the output channels OUT1-OUT4 of the driving circuit 100, in accordance with an embodiment of the present disclosure. As shown in FIG. 3, at time T0, the output signal of the output channel OUT1 has the voltage VPH, and the output signal of the output channel OUT3 has the voltage VPL. At time T1, the switches 121 and 124 are turned off and the charge sharing circuit 102 is turned on (the switches 123 and 126 are turned on), and through the parasitic resistance and parasitic capacitance in the charge sharing paths 111 and 113, the potential of the output signal of the output channel OUT1 gradually decreases from the voltage VPH and the potential of the output signal of the output channel OUT3 gradually increases from the voltage VPL, so as to achieve charge sharing between the output channels OUT1 and OUT3. In some embodiments, after a period of time, the potentials of the output signals of the output channels OUT1 and OUT3 have a potential approximately equal to half of the sum of the voltages VPH and VPL. In the above embodiment, this potential is about 9 Volts.

In some embodiments, each of the switches 121, 123, 124, 126, and the switching switches 122, 125 in FIG. 1 is a transmission gate circuit that includes a P-type field effect transistor (PMOS) and an N-type field effect transistor (NMOS). As mentioned above, in the embodiment of FIG. 1 in which the driving circuit 100 operates in the operating voltage range of about 6 Volts to 12 Volts, and the output channels OUT1 and OUT3 output positive polarity voltages, when each of the switches 121, 123, 124, 126 and the switching switch 122, 125 is on, the gate of the PMOS and the bulk of the NMOS of the above mentioned switches have a voltage of about 6 Volts, and the gate of the NMOS and the base of the PMOS of the above mentioned switches have a voltage of about 12 Volts.

Figure 2:
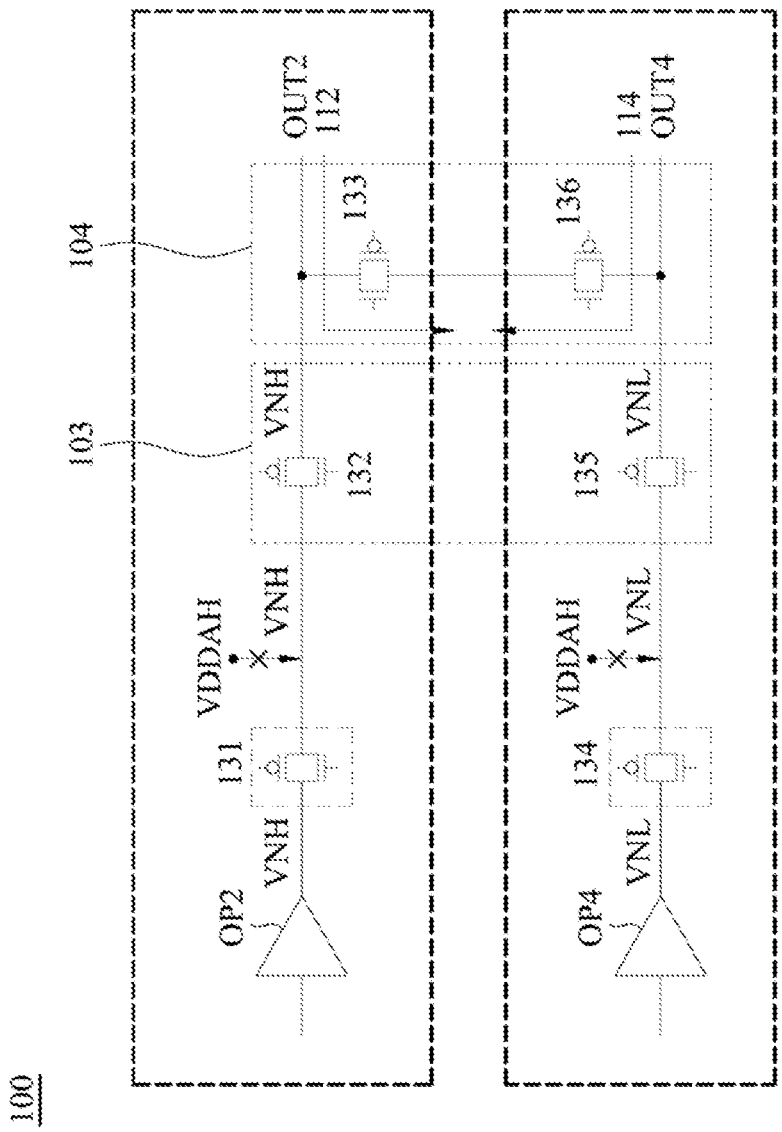
FIG. 2 is a schematic diagram of a driving circuit, in accordance with an embodiment of the present disclosure.

Reference is now made to FIG. 2. FIG. 2 is a schematic diagram of a driving circuit 100, in accordance with an embodiment of the present disclosure. As shown in FIG. 2, the driving circuit 100 includes output stage circuits OP2 and OP4, switches 131 and 134, and a charge sharing circuit 104. Compared with FIG. 1, instead of including switching switches 122 and 125, the switching circuit 101 in FIG. 2 includes the switching switches 132 and 135. In FIG. 2, the switching switch 132 has a first terminal receiving the voltage VNH from the output stage circuit OP2 and a second terminal coupled to the output channel OUT2; the switching switch 135 has a first terminal receiving the voltage VNL from the output stage circuit OP4 and a second terminal coupled to the output channel OUT4. The charge sharing circuit 104 has a first terminal coupled to the output channel OUT2 and a second terminal coupled to the output channel OUT4. In some embodiments, the charge sharing circuit 104 further includes switches 133 and 136.

In some embodiments, when the charge sharing circuit 104 is turned off, the output stage circuit OP2 is configured to output the voltage VNH, and the output stage circuit OP4 is configured to output the voltage VNL. In some embodiments, the voltage VNH corresponds to the higher voltage of the second polarity (e.g., referred to as a negative polarity and corresponding to another operating voltage interval of the driving circuit 100) of the driving circuit 100, and the voltage VNL corresponds to the lower voltage of the second polarity of the driving circuit 100. For example, in some embodiments, the circuit elements of the driving circuit 100 shown in FIG. 2 operate in another operating voltage range of the driving circuit 100, and the operating voltage range is about 0 Volts to 6 Volts. Therefore, the output stage circuit OP2 outputs the voltage VNH of about 6 Volts to the output channel OUT2 through the turning on the switch 131 and the switching switch 132, and the output stage circuit OP4 outputs the voltage VNL of about 0 Volts to the output channel OUT4 through turning on the switch 134 and the switching switch 135.

In some embodiments, when the switches 131 and 134 are turned off, the charge sharing circuit 104 is configured to be turned on to provide charge sharing between the output channels OUT2 and OUT4, as shown by the charge sharing paths 112 and 114. As shown in FIG. 3, at time T0, the output signal of the output channel OUT2 has the voltage VNH, and the output signal of the output channel OUT4 has the voltage VNL. At time T1, the switches 131 and 134 and turns off and the charge sharing circuit 104 is turned on (e.g., the switches 133 and 136 are turned-on), and through the parasitic resistance and parasitic capacitance on the charge sharing paths 112 and 114 the potential of the output signal of the output channel OUT2 gradually decreases from the voltage VNH and the potential of the output signal of the output channel OUT 4 gradually increases from the voltage VNL, so as to achieve charge sharing between the output channels OUT2 and OUT4. In some embodiments, after a period of time, the potentials of the output signals of the output channels OUT2 and OUT4 have a potential approximately equal to half of the sum of the voltages VNH and VNL. In the above embodiment, this potential is about 3 Volts.

In some embodiments, each of the switches 131, 133, 134, 136, and the switching switches 132, 135 in FIG. 2 is a transmission gate circuit that includes a P-type field effect transistor (PMOS) and an N-type field effect transistor (NMOS). As mentioned above, in the embodiment in which the driving circuit 100 in FIG. 2 operates in the range of the operating voltage range of about 0 Volts to 6 Volts and the output channels OUT2 and OUT4 output negative polarity voltages, when each of the switches 131, 133, 134, and 136 and the switching the switches 132, 135 is turned on, the gate of the PMOS and the base of the NMOS of the aforementioned switches have a voltage of about 0 Volts, and the gate of the NMOS and the base of the PMOS of the aforementioned switches have a potential of about 6 Volts.

Reference is now made to FIGS. 1 and 2 at the same time. In some embodiments, either the output stage circuits OP1-0P4 output voltages VPH, VPL, VNH, VNL or the charge sharing circuits 102, 104 are turned on to provide charge sharing between output channels, the half voltage VDDAH (e.g., 6 Volts), having a potential approximately equal to half of the sum of the voltages VPH and VNL, is not provided to the lines between the output stage circuits OP1-0P4 and the switching circuits 101, 103, as shown in FIGS. 1 and 2.

In some embodiments, the output channels OUT1 and OUT3 in FIG. 1 correspond to odd-numbered output channels of the driving circuit 100, while the output channels OUT2 and OUT4 in FIG. 2 correspond to even-numbered output channels of the driving circuit 100.

In some approaches, the charge sharing paths between the output channels not only include charge sharing circuits, but additionally include switching circuits and the like. This results in power dissipation and delay caused by parasitic capacitance and resistance in the transmission path. Compared with these approaches, the charge sharing path between the output channels of the present application does not need to go through switching circuits, which reduces the power consumption of the circuit, further improves the operation speed, and improves the performance of the driving circuit.

The configurations of FIGS. 1-3 are given for illustrative purposes. The various implementations of FIGS. 1-3 are within the scope of an embodiment of the present application. For example, in some embodiments, the operating voltage ranges corresponding to the positive and negative polarities can be any suitable voltages, such as about 0 Volts to 18 Volts or −9 Volts to 9 Volts, and those skilled in the art can design according to the actual application of the embodiments in the present disclosure. In other embodiments, the driving circuit 100 includes more than 4 output channels.

Figure 4A:
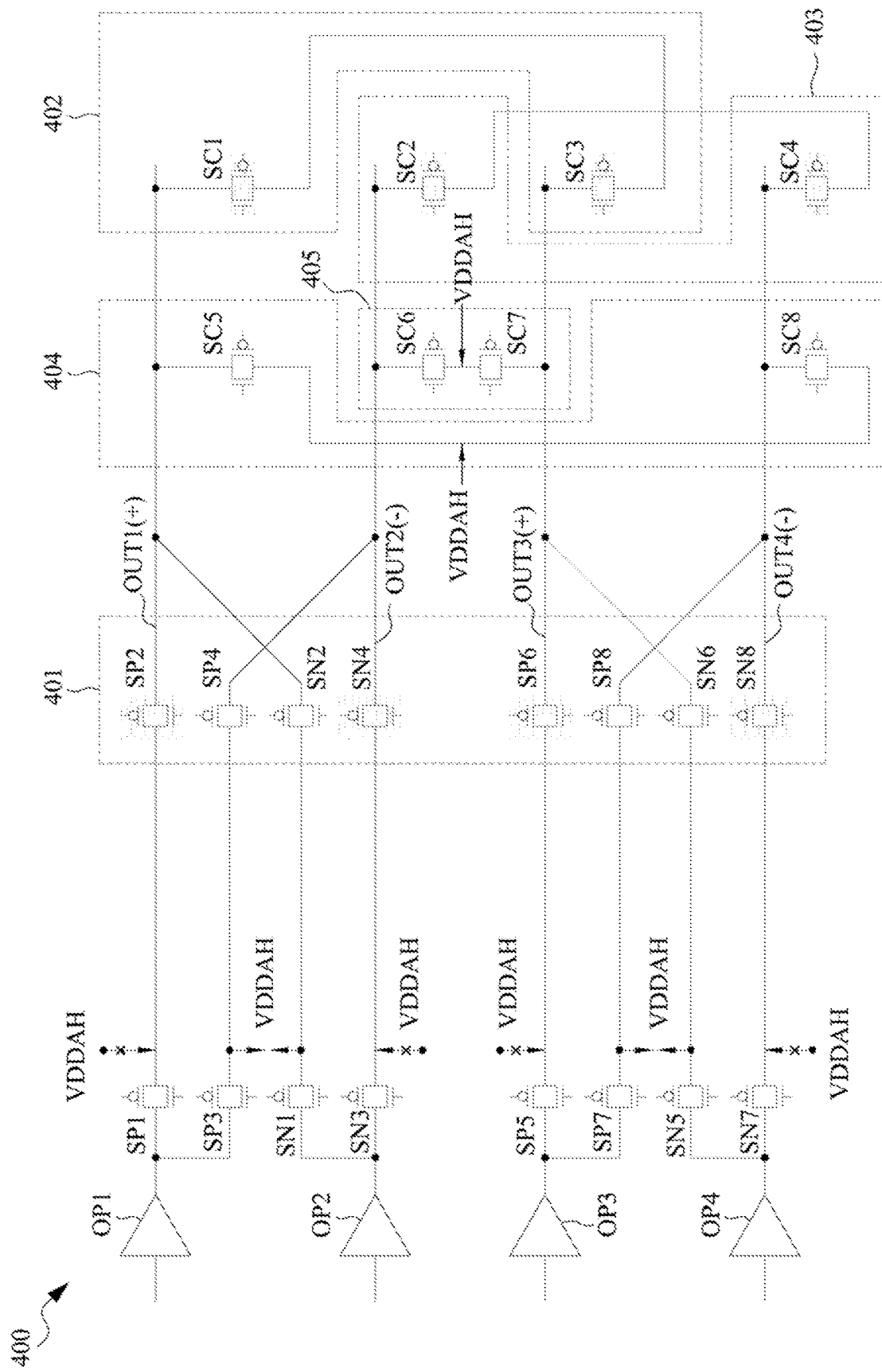
FIG. 4A is a schematic diagram of a driving circuit, in accordance with an embodiment of the present disclosure.
Figure 4B:
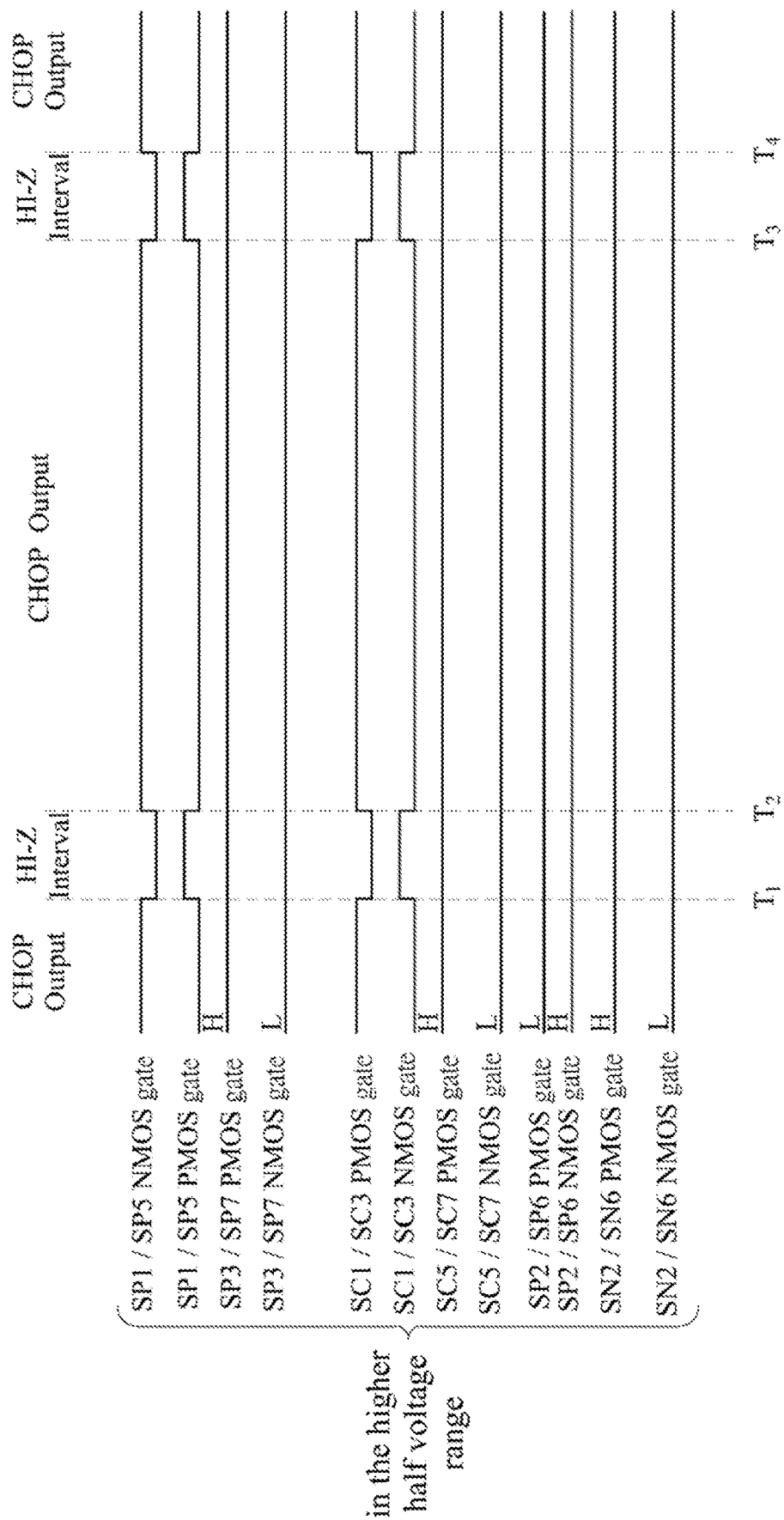
FIGS. 4B to 4C are schematic diagrams of control signals in the driving circuit correspondingly as shown in FIG. 4A, in accordance with an embodiment of the present disclosure.
Figure 4C:
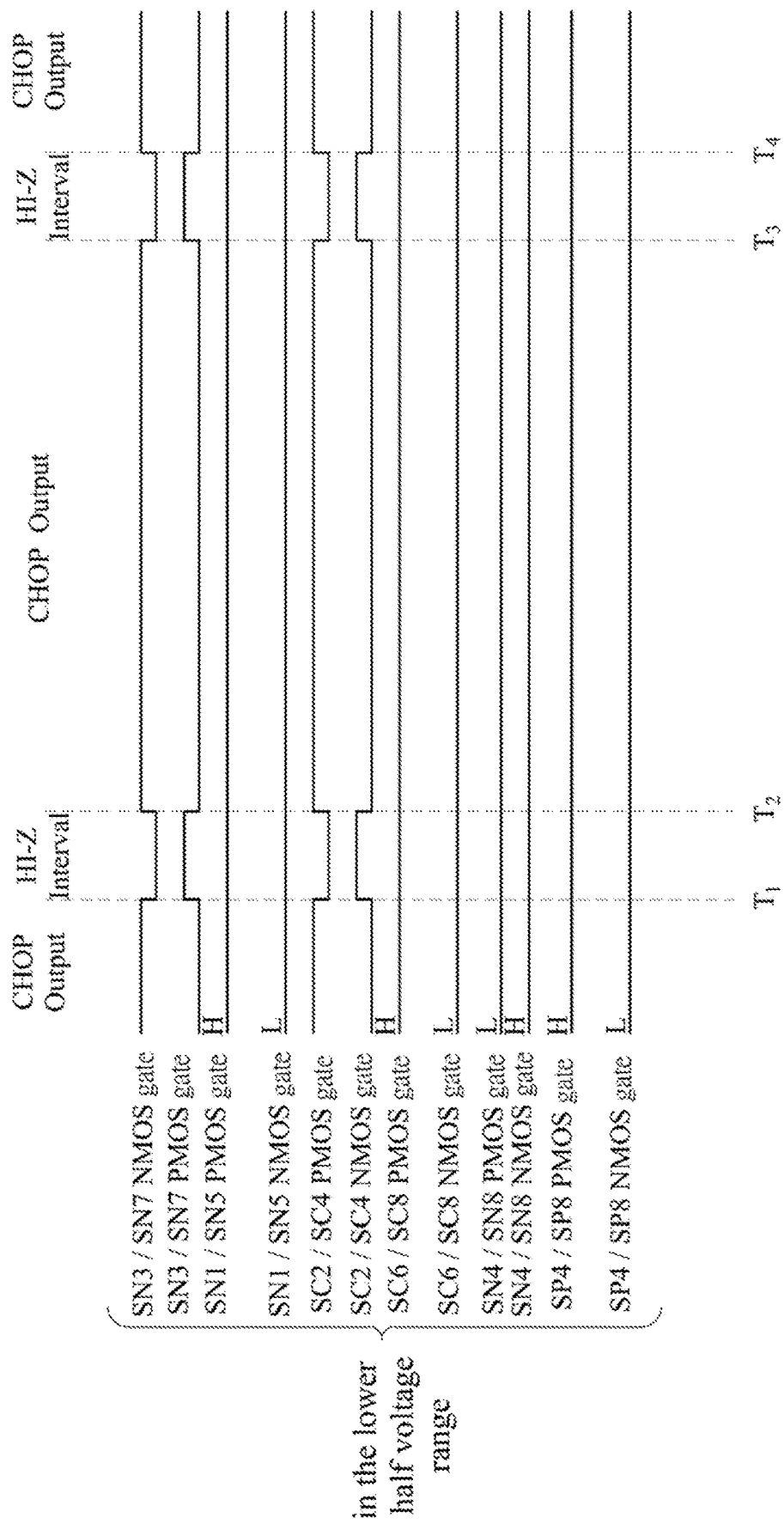

Reference is now made to FIG. 4A. FIG. 4A is a schematic diagram of a driving circuit 400, in accordance with an embodiment of the present disclosure. FIGS. 4B to 4C are schematic diagrams of control signals received by gates of the elements in the driving circuit 400 correspondingly as shown in FIG. 4A, in accordance with an embodiment of the present disclosure. With respect to the embodiments of FIGS. 1-3, for ease of understanding, like elements in FIGS. 4A-4B are designated with the same reference numerals.

In some embodiments, the driving circuit 400 is configured with respect to, for example, the driving circuit 100. For illustration, as shown in FIG. 4A, the driving circuit 400 includes output stage circuits OP1-OP4, switches SP1, SP3, SP5, SP7, SN1, SN3, SN5, SN7, switching circuit 401, and charge sharing circuits 402-405. In some embodiments, the switches SP1, SP3, SP5, SP7, SN1, SN3, SN5, SN7 are configured with respect to, for example, the switches 121, 124, 131, 134 of FIGS. 1-2. The switching circuit 401 is configured with respect to, for example, the switching circuits 101 and 103 shown in FIGS. 1-2. The charge sharing circuit 402 is configured with respect to, for example, the charge sharing circuit 102 in FIG. 1. The charge sharing circuit 403 is configured with respect to, for example, the charge sharing circuit 104 in FIG. 2.

In some embodiments, the switching circuit 401 further includes switching switches SP2, SP4, SP6, SP8, SN2, SN4, SN6, and SN8. As shown in FIG. 4A, the switching switch SP2 is coupled between the switch SP1 and the output channel OUT1. The switching switch SP4 is coupled between the switch SP3 and the output channel OUT2. The switching switch SN2 is coupled between the switch SN1 and the output channel OUT1. The switching switch SN4 is coupled between the switch SN3 and the output channel OUT2. The switching switch SP6 is coupled between the switch SP5 and the output channel OUT3. The switching switch SP8 is coupled between the switch SP7 and the output channel OUT4. The switching switch SN6 is coupled between the switch SN5 and the output channel OUT3. The switching switch SN8 is coupled between the switch SN7 and the output channel OUT4.

The charge sharing circuit 402 includes a first terminal coupled to the output channel OUT1 and a second terminal coupled to the output channel OUT3. In some embodiments, the charge sharing circuit 402 includes switches SC1 and SC3 that are connected in series. The switch SC1 is coupled to the output channel OUT1, and the switch SC3 is coupled between the switch SC1 and the output channel OUT3. In some embodiments, the charge sharing circuit 402 is configured to provide charge sharing between the output channels OUT1 and OUT3. In some embodiments, the switches SC1 and SC3 are configured with respect to, for example, the switches 123 and 126 in FIG. 1.

The charge sharing circuit 403 includes a first terminal coupled to the output channel OUT2 and a second terminal coupled to the output channel OUT4. In some embodiments, the charge sharing circuit 403 includes switches SC2 and SC4 connected in series. The switch SC2 is coupled to the output channel OUT2, and the switch SC4 is coupled between the switch SC2 and the output channel OUT4. In some embodiments, the charge sharing circuit 403 is configured to provide charge sharing between the output channels OUT2 and OUT4. The switches SC2 and SC4 are configured with respect to, for example, the switches 133 and 136 in FIG. 2.

The charge sharing circuit 404 includes a first terminal coupled to the output channel OUT1 and a second terminal coupled to the output channel OUT4. In some embodiments, the charge sharing circuit 404 is configured to provide charge sharing between the output channels OUT1 and OUT4. In some embodiments, the charge sharing circuit 404 includes switches SC5 and SC8 that are connected in series. The switch SC5 is coupled to the output channel OUT1, and the switch SC8 is coupled between the switch SC5 and the output channel OUT4.

The charge sharing circuit 405 includes a first terminal coupled to the output channel OUT2 and a second terminal coupled to the output channel OUT3. In some embodiments, the charge sharing circuit 405 is configured to provide charge sharing between the output channels OUT2 and OUT3. In some embodiments, the charge sharing circuit 405 includes switches SC6 and SC7 connected in series. The switch SC6 is coupled to the output channel OUT2, and the switch SC7 is coupled between the switch SC6 and the output channel OUT3.

In some embodiments, the driving circuit 400 can switch to an appropriate mode of operation modes A-D according to the application of the internal circuit (not shown) to be driven to output the required voltages from the output channels separately. For example, as shown in Table 1, in response to the polarity control signal POL and the output polarity inversion signal (i.e., square inversion) SQINV has a high logic value (H) and a low logic value (L), the output channels OUT1-OUT4 output positive polarity(+) or negative polarity(−) output signals separately.

TABLE 1

Polarity of the output channels OUT1-OUT4 corresponding to the polarity control signal POL and the output polarity inversion signal SQINV

| mode | SQINV | POL | OUT1 | OUT2 | OUT3 | OUT4 |
|------|-------|-----|------|------|------|------|
| A | L | H | + | − | + | − |
| B | L |  | − | + | − | + |
| C | H | H | + | − | − | + |
| D | L |  | − | + | + | − |

For example, in mode A, when the polarity control signal POL has a high logic value and the output polarity inversion signal SQINV has a low logic value, the output signals of the output channels OUT1 and OUT3 have the same polarity (positive polarity) and The output signals of the output channels OUT2 and OUT4 have the same polarity (negative polarity). The corresponding four operation modes will be described in conjunction with FIGS. 4A-7C.

Reference is now made to FIGS. 4A-4C at the same time. FIGS. 4B-4C are schematic diagrams of control signals at the gates in the driving circuit 400 correspondingly as shown in FIG. 4A, in accordance with an embodiment of the present disclosure. The embodiments in FIGS. 4A-4C correspond to the mode A in which the polarity control signal POL has a high logic value and the output polarity inversion signal SQINV has a low logic value.

In some embodiments, when the output polarity inversion signal SQINV has a low logic value, the output signals of the output channels OUT1 and OUT3 have the same polarity, and the output signals of the output channels OUT2 and OUT4 have the same polarity. Therefore, in mode A, the charge sharing circuits 404-405 are turned off, and alternatively stated, the switches SC5-SC8 are turned off (the gate signals of the PMOS in the switches SC5-SC8 have high logic value (H) and the gate signals of the NMOS have low logic value (L), as shown in FIG. 4B-4C). Meanwhile, in some embodiments, the node where the switches SC5 and SC8 are coupled to each other has the half voltage VDDAH that is as a protection voltage to protect the PMOS and NMOS in the switches SC5 and SC8 from experiencing unexpected cross voltage. Likewise, the node where the switches SC6 and SC7 are coupled to each other has the half voltage VDDAH that is as a protection voltage to protect the PMOS and NMOS in the switches SC6 and SC7 from experiencing unexpected cross voltage.

In addition, in mode A, the switches SP3, SP4, SN1, SN2, SP7, SF8, SNS, and SN6 are kept turned-off; while in the embodiment shown in FIGS. 4A-4C, the switches SP2, SN4, SP6 and SN8 remain turned-on.

Continuing to refer to FIGS. 4A-4C, before time T1 (which is regarded as the output stage of the output stage circuit), the switches SP1, SN3, SP5, SN7 are turned on and the output stage circuits OP1-OP4 output the voltage of corresponding polarity to the output channels OUT1-OUT4. The switches SC1-SC4 are turned off.

Then, between times T1 and T2 (referred to as the charge sharing phase, HI-Z), the gate signals of the switches SP1, SN3, SP5, and SN7 are inverted so that these switches are turned off. At the same time, the gate signals of the switches SC1-SC4 are inverted so that these switches are turned on, thereby providing charge sharing between the output channel OUT1 and the output channel OUT3 and charge sharing between the output channel OUT2 and the output channel OUT4 separately.

As shown in FIGS. 4B-4C, the driving circuit 400 continues to switch between the output stage of the output stage circuit and the charge sharing stage HI-Z in mode A. For example, time T2 to time T3 is the output stage of the output stage circuit, time T3 to time T4 is the charge sharing phase HI-Z, and after time T4 is the output stage of the output stage circuit. Therefore, the relevant descriptions are not repeated here.

Figure 5A:
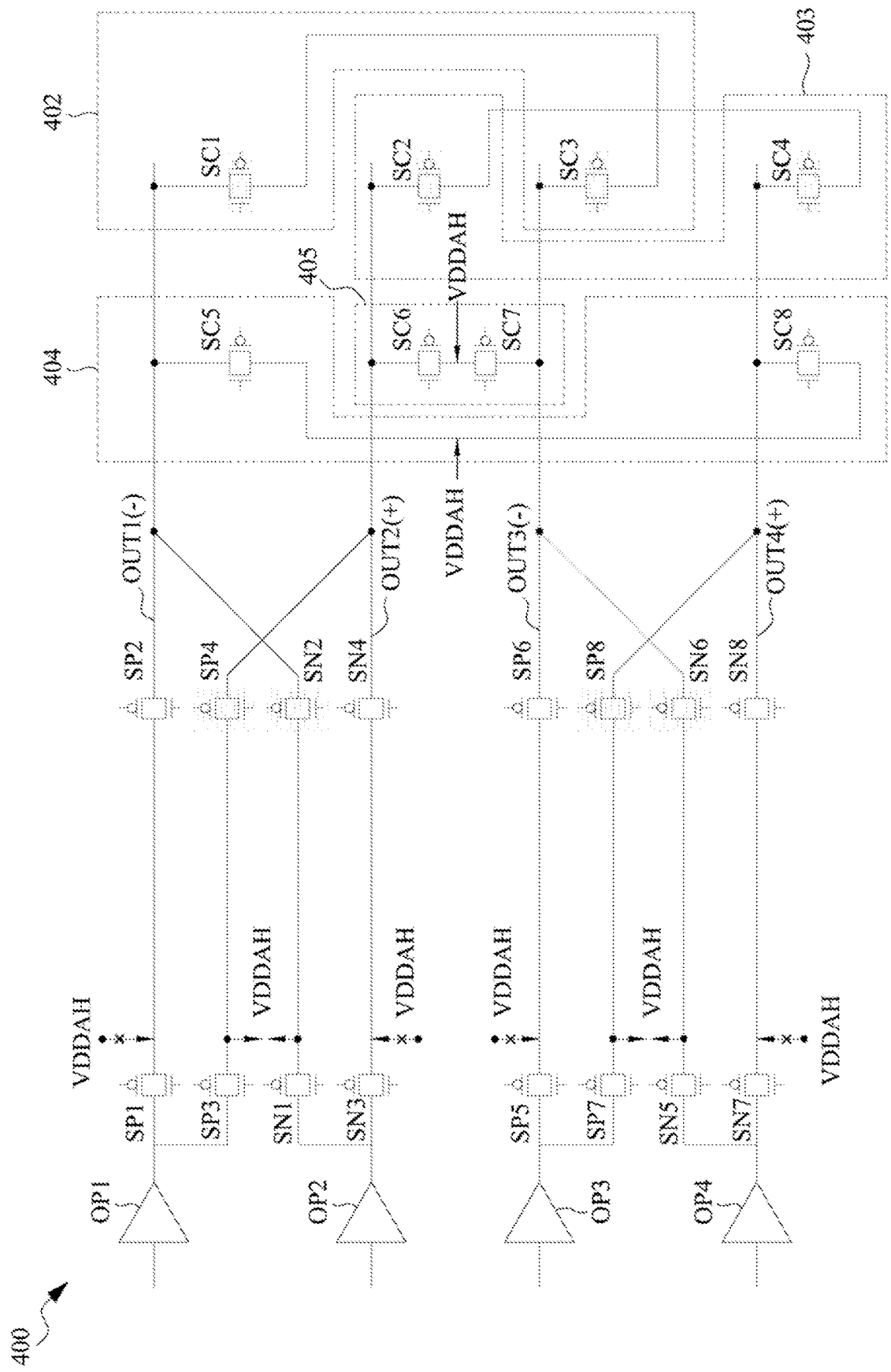
FIG. 5A is a schematic diagram of a driving circuit, in accordance with an embodiment of the present disclosure.
Figure 5B:
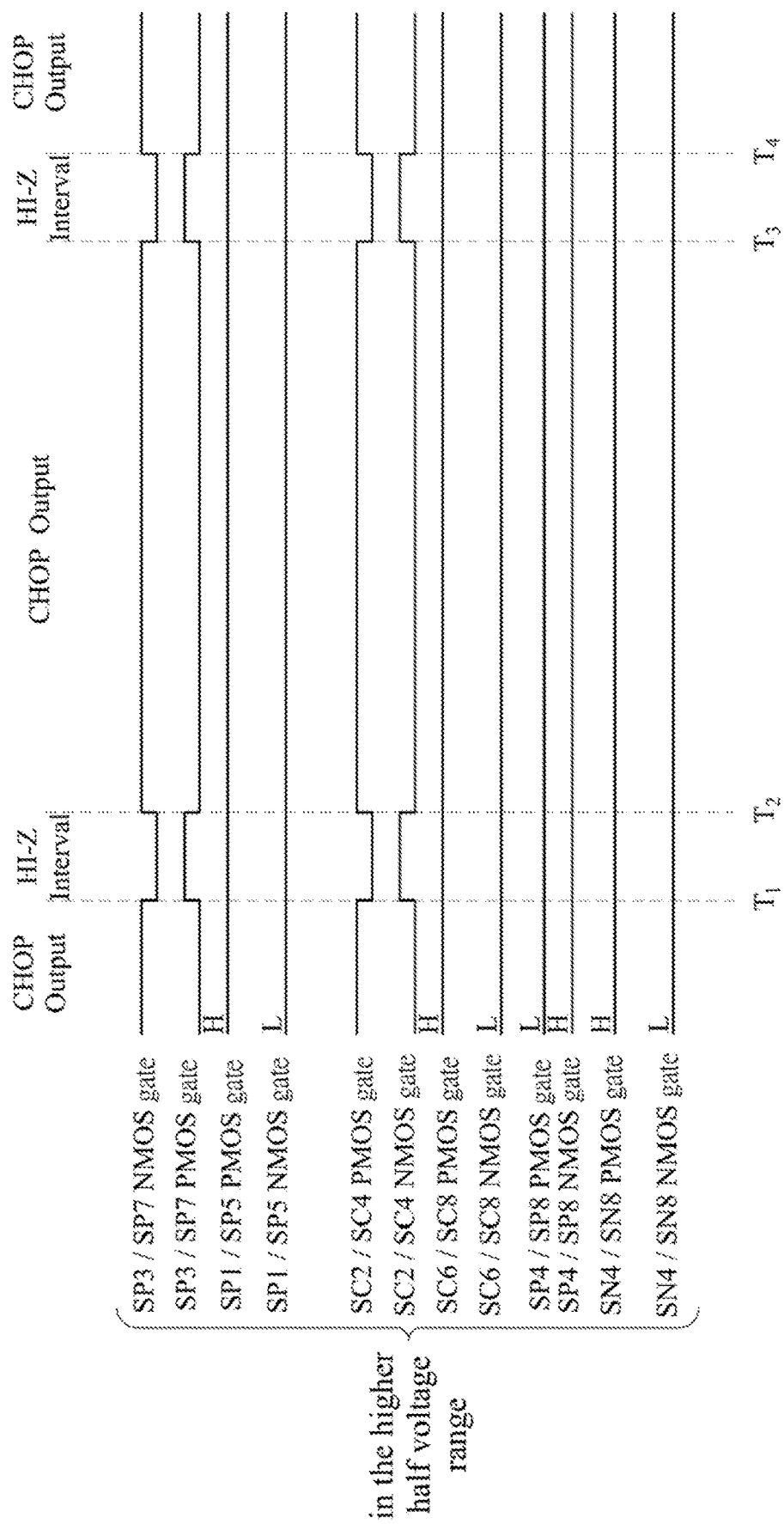
FIGS. 5B to 5C are schematic diagrams of control signals in the driving circuit correspondingly as shown in FIG. 5A, in accordance with an embodiment of the present disclosure.
Figure 5C:
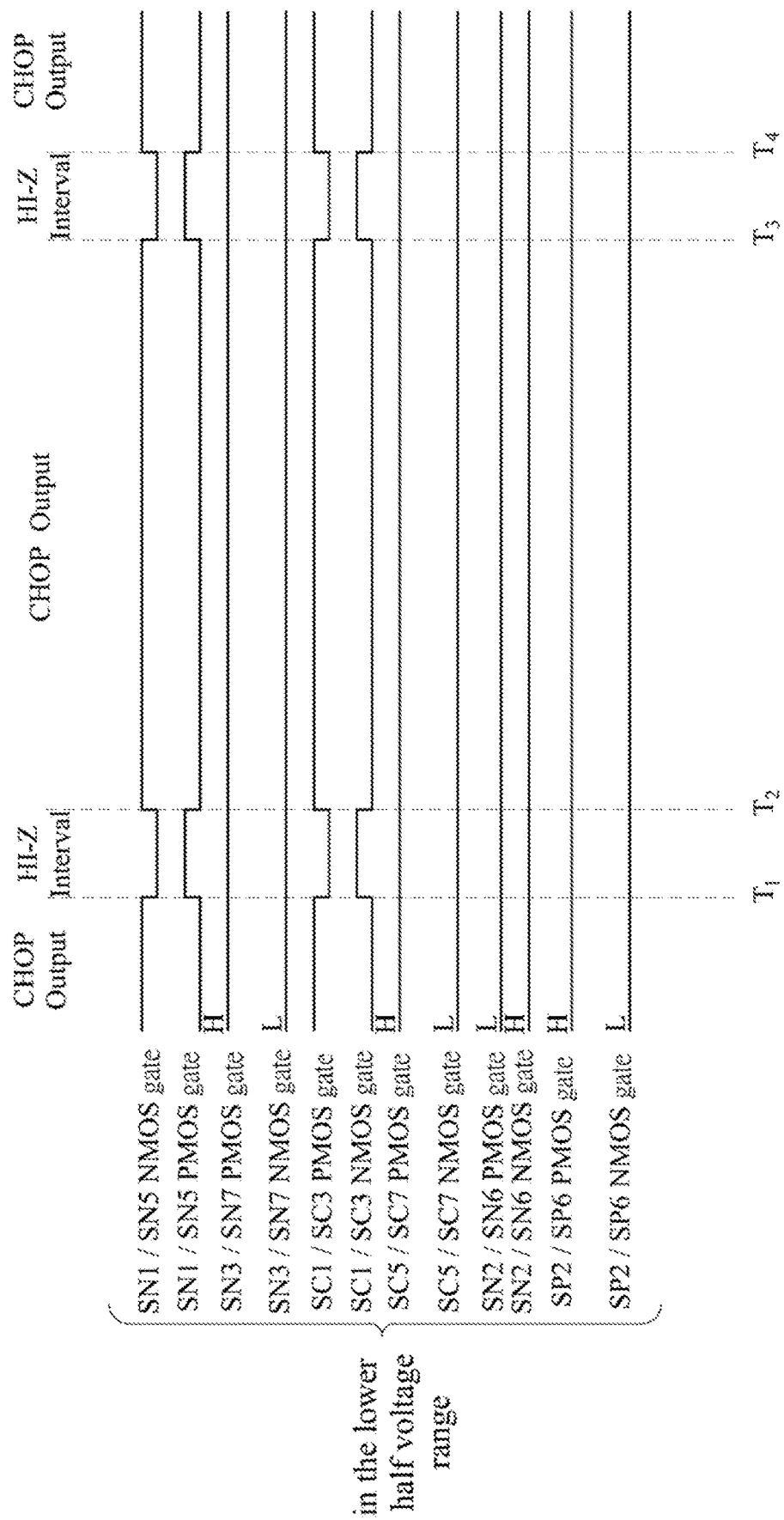

Reference is now made to FIGS. 5A-5C at the same time. FIGS. 5B-5C are schematic diagrams of control signals at the gates in the driving circuit 400 correspondingly as shown in FIG. 5A, in accordance with an embodiment of the present disclosure. The embodiments in FIGS. 5A-5C correspond to the mode B in which the polarity control signal POL has a low logic value and the output polarity inversion signal SQINV has a low logic value.

Compared to the embodiment in FIGS. 4A-4C, in mode B, the charge sharing circuits 404-405 are still turned off. The configurations of the charge sharing circuits 404-405 in FIGS. 5A-5C are similar to those between the charge sharing circuits 404-405 in FIGS. 4A-4C. Therefore, repetitious description is omitted here.

In mode B, the switches SP1, SN3, SP5, and SN7 are kept off, and the switches SP2, SN4, SP6, and SN8 are also kept off.

Continuing to refer to FIGS. 5A-5C, before time T1 (the output stage of the output stage circuit), the switches SP3, SP4, SN1, SN2, SP7, SF8, SN5, SN6 are turned on. The output stage circuit OP1 outputs the positive polarity voltage to the output channel OUT2; the output stage circuit OP2 outputs the negative polarity voltage to the output channel OUT1; the output stage circuit OP3 outputs the positive polarity voltage to the output channel OUT4; and the output stage circuit OP4 outputs the negative polarity voltage to the output channel OUT3. The switches SC1-SC4 are turned off.

Then, between time T1 and time T2 (charge sharing phase, HI-Z), the gate signals of switches SP3, SN1, SP7, and SN5 are inverted, so that these switches are turned off. At the same time, the gate signals of the switches SC1-SC4 are inverted so that these switches are turned on, thereby providing charge sharing between the output channel OUT1 and the output channel OUT3 and charge sharing between the output channel OUT2 and the output channel OUT4 separately.

As shown in FIGS. 5B-5C, the driving circuit 400 continues to switch between the output stage of the output stage circuit and the charge sharing stage HI-Z in mode B. For example, time T2 to time T3 is the output stage of the output stage circuit, time T3 to time T4 is the charge sharing phase HI-Z, and after time T4 is the output stage of the output stage circuit. Therefore, the relevant descriptions are not repeated here.

Figure 6A:
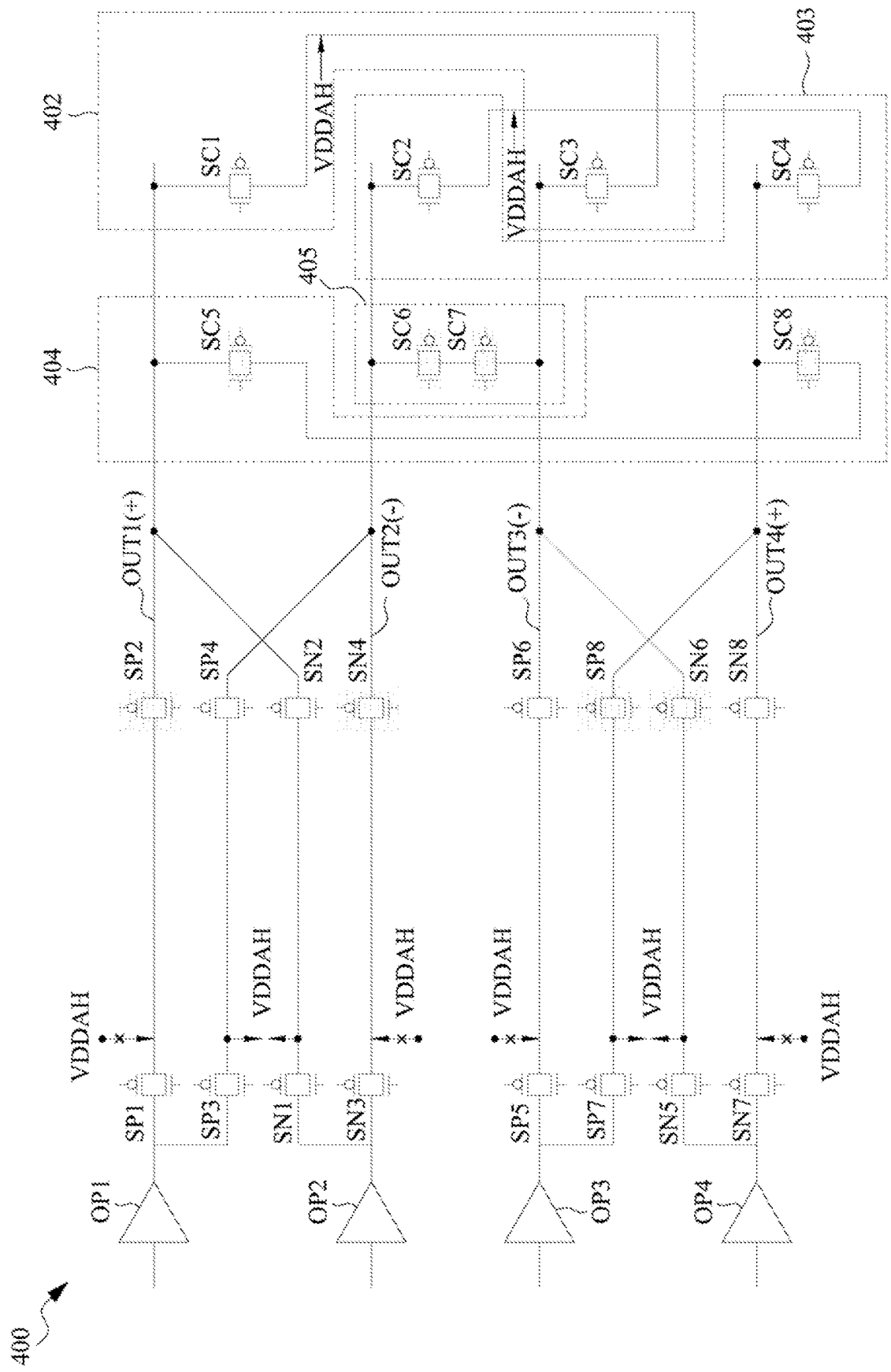
FIG. 6A is a schematic diagram of a driving circuit, in accordance with an embodiment of the present disclosure.
Figure 6B:
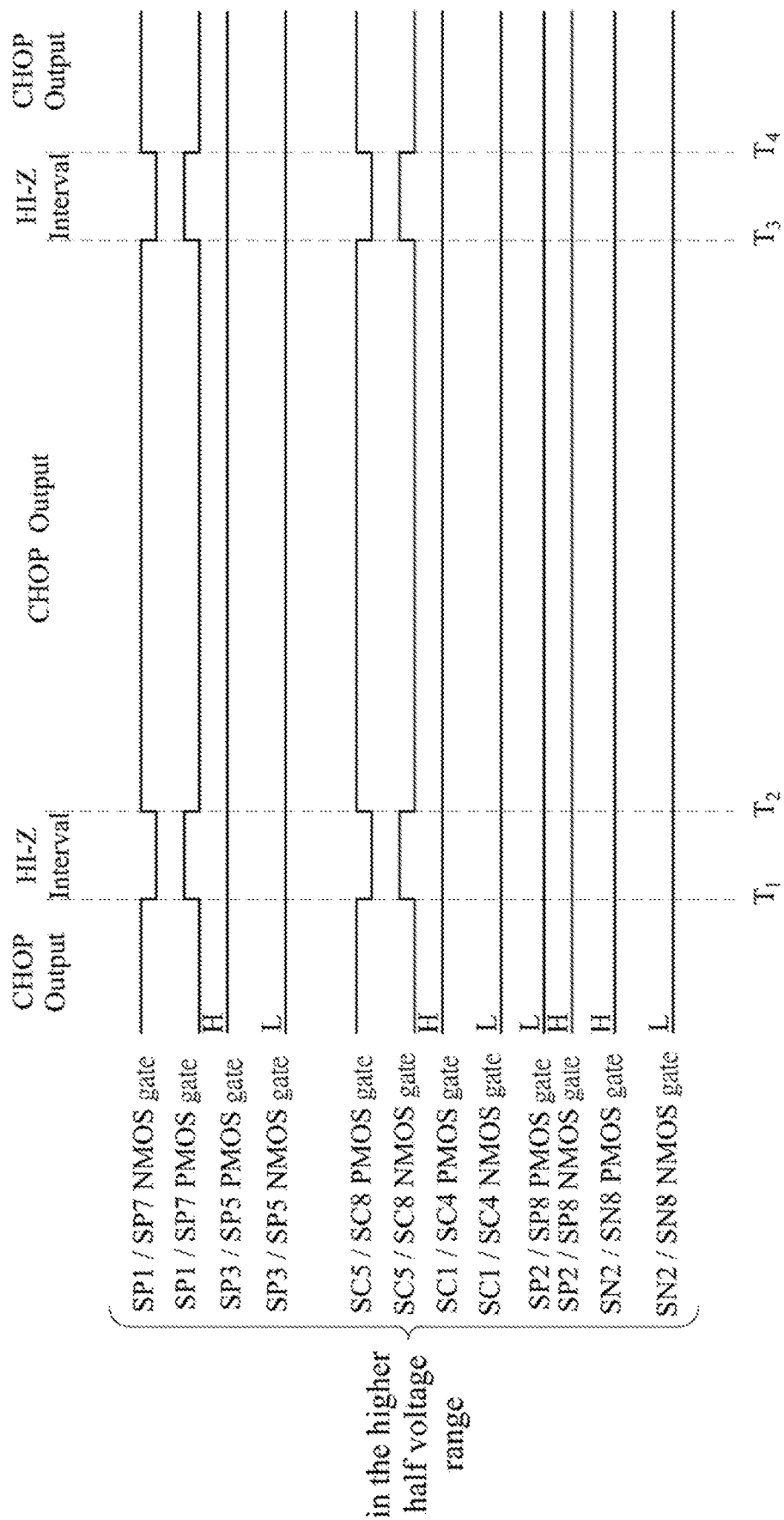
FIGS. 6B to 6C are schematic diagrams of control signals in the driving circuit correspondingly as shown in FIG. 6A, in accordance with an embodiment of the present disclosure.
Figure 6C:
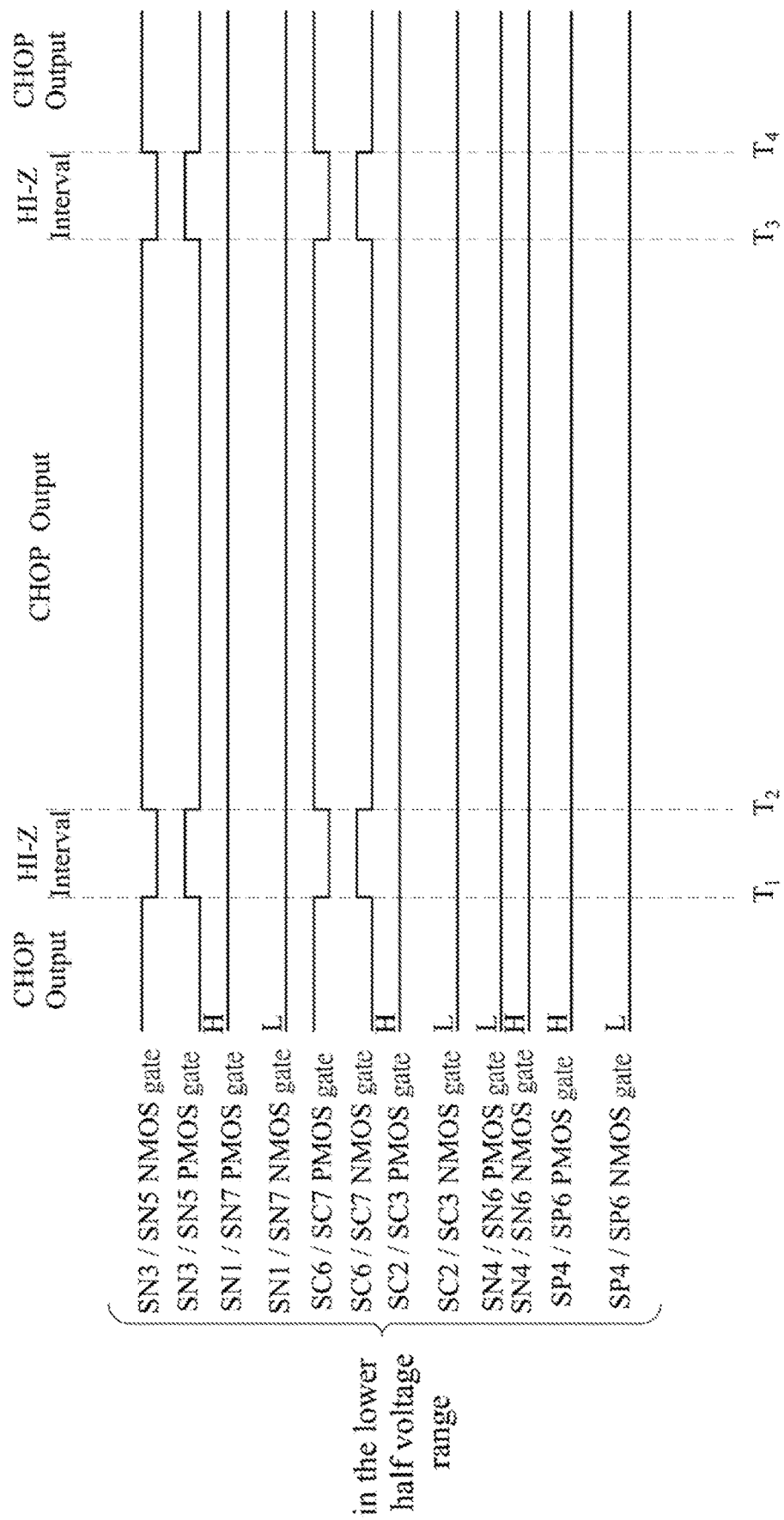

Reference is now made to FIGS. 6A-6C at the same time. FIGS. 6B-6C are schematic diagrams of control signals at the gates in the driving circuit 400 correspondingly as shown in FIG. 6A, in accordance with an embodiment of the present disclosure. The embodiments in FIGS. 6A-6C correspond to the mode C in which the polarity control signal POL has a high logic value and the output polarity inversion signal SQINV has a high logic value.

In some embodiments, when the output polarity inversion signal SQINV has a high logic value, the output signals of the output channels OUT1 and OUT4 have the same polarity, and the output signals of the output channels OUT2 and OUT3 have the same polarity. Therefore, in mode C, the charge sharing circuits 402-403 are turned off, and alternatively stated, the switches SC1-SC4 are turned off (the gate signals of the PMOS in the switches SC1-SC4 have high logic value (H) and the gate signals of the NMOS have low logic value(L), as shown in FIGS. 6B-6C). Meanwhile, in some embodiments, the node where the switches SC1 and SC4 are coupled to each other has the half voltage VDDAH as a protection voltage to protect the PMOS and NMOS in the switches SC1 and SC4 from experiencing unexpected cross voltage. Likewise, the node where the switches SC2 and SC3 are coupled to each other has the half voltage VDDAH as a protection voltage to protect the PMOS and NMOS in the switches SC2 and SC3 from experiencing unexpected cross voltage.

In addition, in mode C, the switches SP3, SP4, SN1, SN2, SP7, SP8, SN5, and SN6 are kept off; while in the embodiment shown in FIGS. 6A-6C, the switches SP2, SN, SP6 and SP8 are kept on.

Continuing to refer to FIGS. 6A-6C, before time T1 (the output stage of the output stage circuit), the switches SP1, SN3, SP7, and SN5 are turned on, and the output stage circuits OP1-CP4 output voltages of corresponding polarities to the output channels OUT1-OUT 4. The charge sharing circuits 404-405 are turned off. That is, the switches SC5-SC8 are turned off.

Then, between times T1 and T2 (charge sharing phase, HI-Z), the gate signals of the switches SP1, SN3, SP7, and SN5 are inverted, so that these switches are turned off. At the same time, the gate signals of the switches SC5-SC8 are inverted so that these switches are turned on, thereby providing charge sharing between the output channel OUT1 and the output channel OUT 4 and charge sharing between the output channel OUT2 and the output channel OUT separately.

As shown in FIGS. 6B-6C, the driving circuit 400 continues to switch between the output stage circuit output stage and the charge sharing stage HI-Z in mode A. For example, time T2 to time T3 are the output stage of the output stage circuit, time T3 to time T4 is the charge sharing phase HI-Z and after time T4 is the output stage of the output stage. Therefore, the relevant descriptions are not repeated here.

Figure 7A:
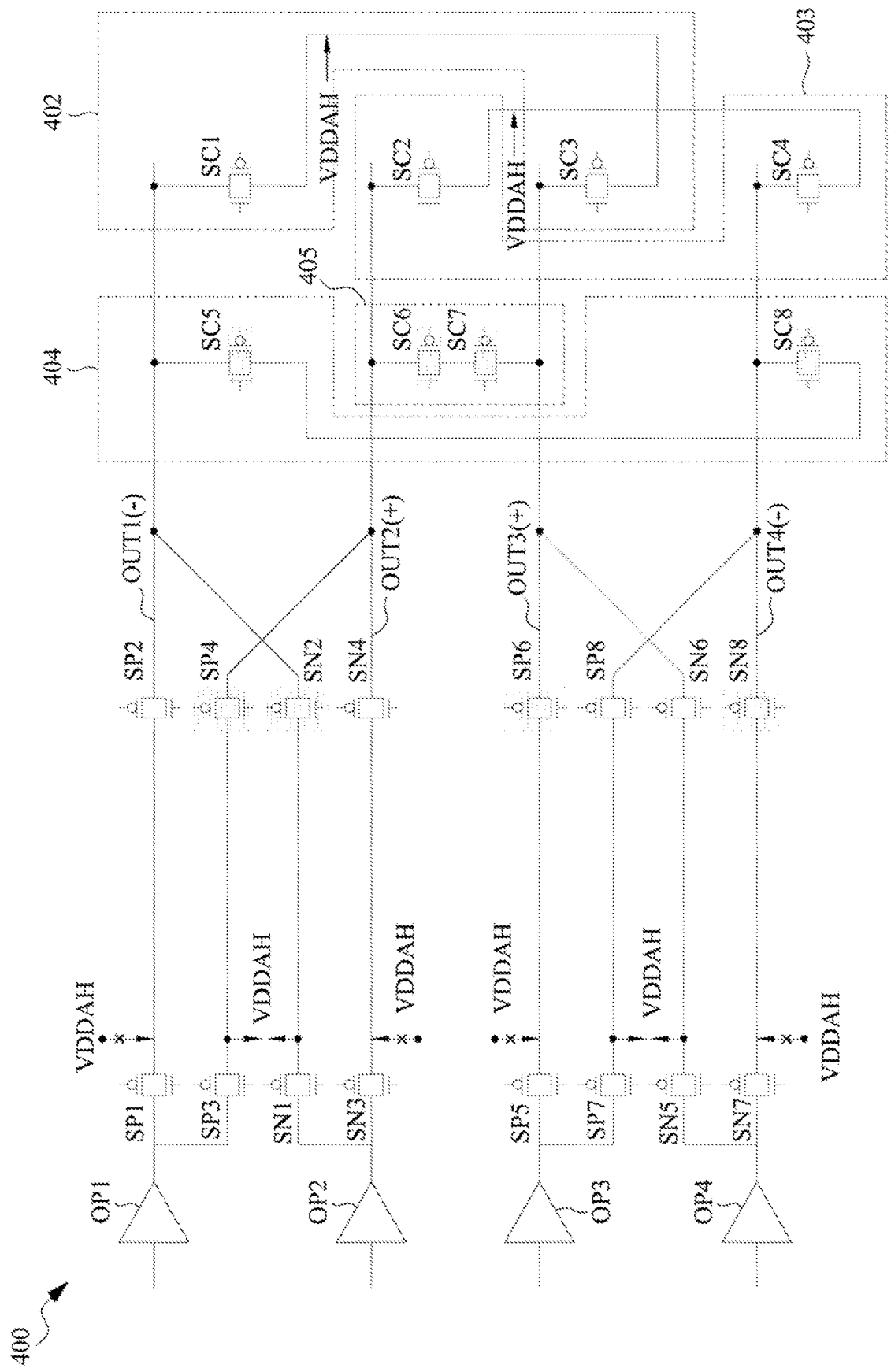
FIG. 7A is a schematic diagram of a driving circuit, in accordance with an embodiment of the present disclosure.
Figure 7B:
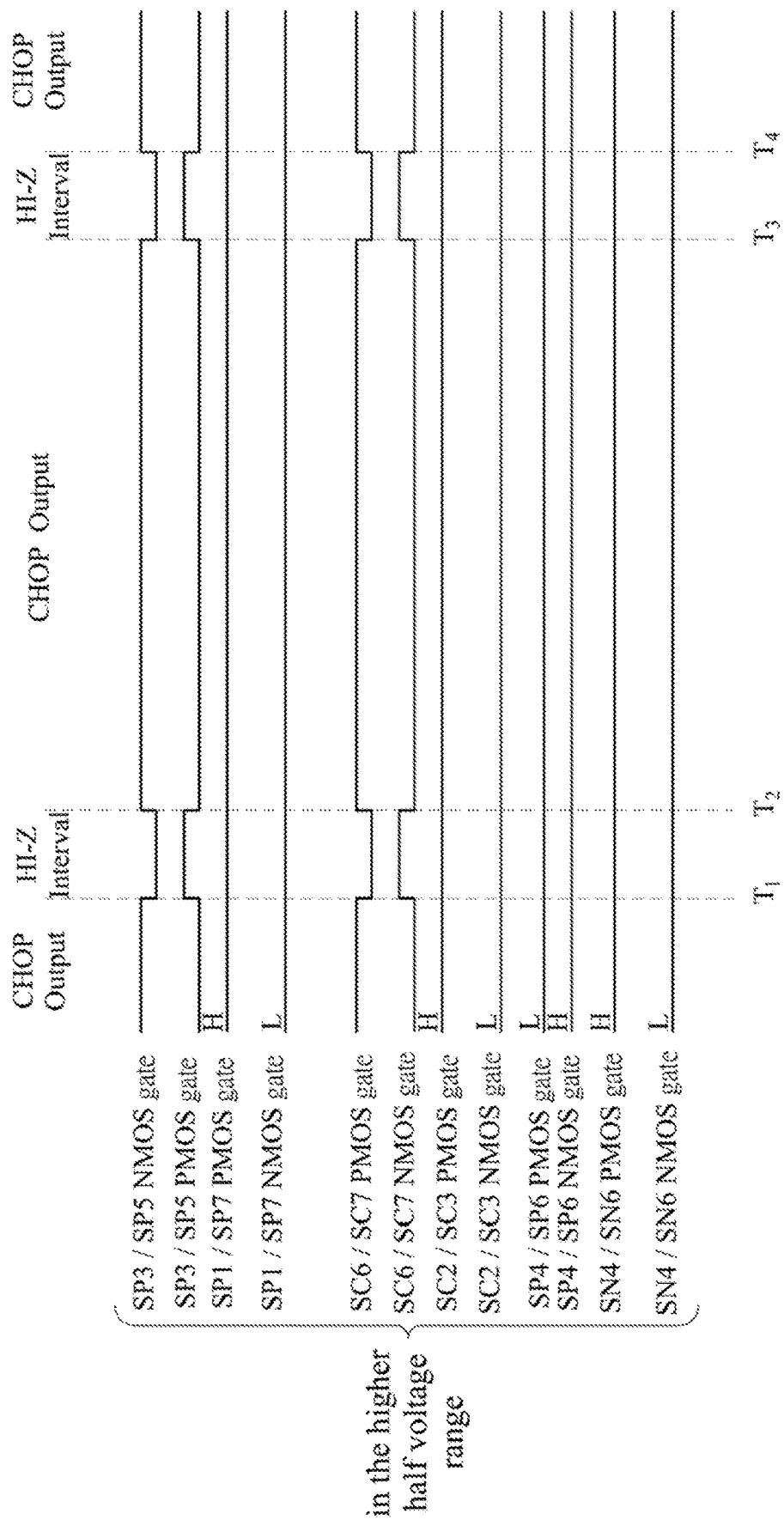
FIGS. 7B to 7C are schematic diagrams of control signals in the driving circuit correspondingly as shown in FIG. 7A, in accordance with an embodiment of the present disclosure.
Figure 7C:
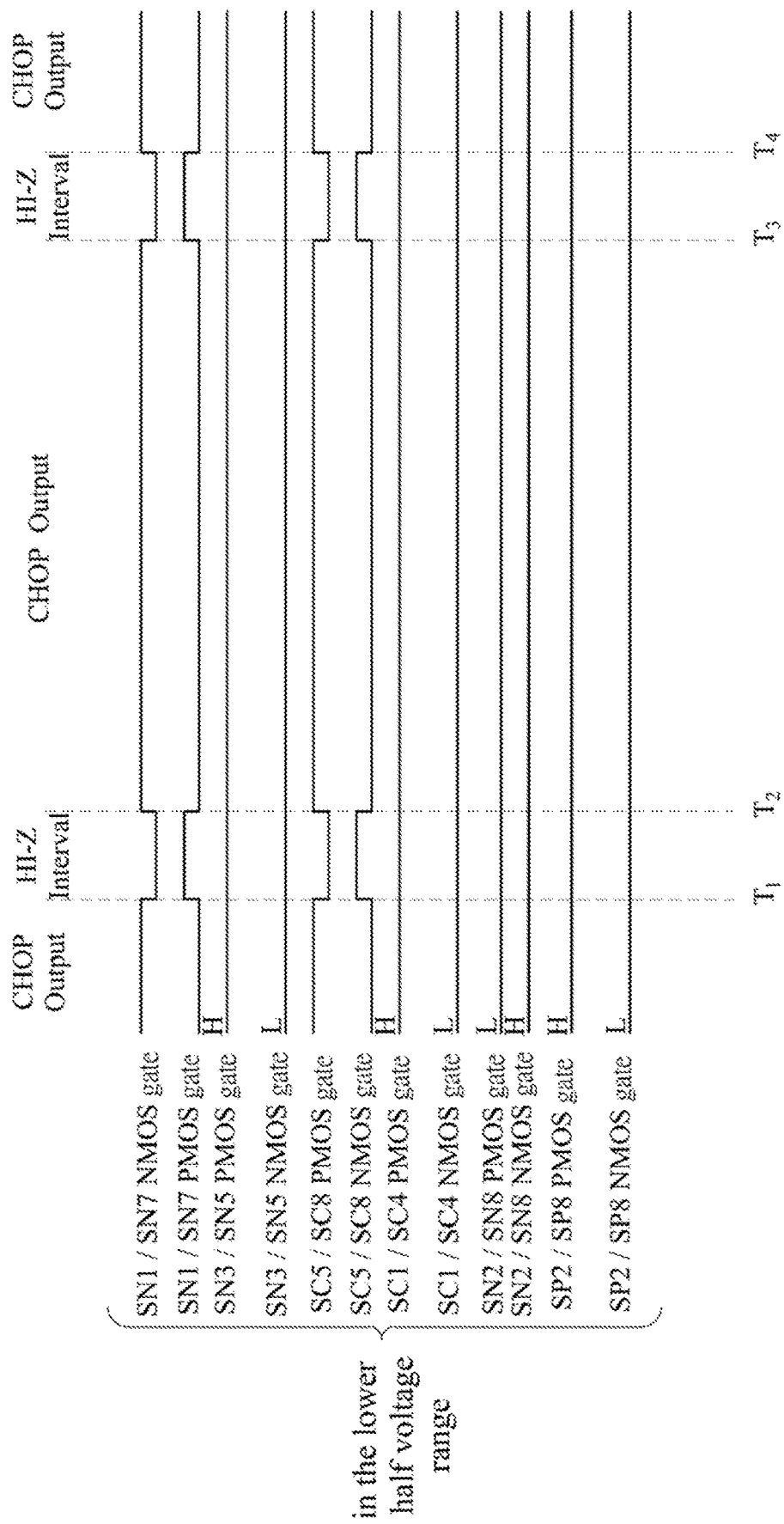

Reference is now made to FIGS. 7A-7C at the same time. FIGS. 7B-7C are schematic diagrams of control signals at the gates in the driving circuit 400 correspondingly as shown in FIG. 7A, in accordance with an embodiment of the present disclosure. The embodiments in FIGS. 7A-7C correspond to the mode D in which the polarity control signal POL has a low logic value and the output polarity inversion signal SQINV has a high logic value.

Compared to the embodiment in FIGS. 6A-6C, in mode D, the charge sharing circuits 402-403 are still turned off. The configurations of the charge sharing circuits 402 to 403 in FIGS. 6A-6C are similar to those between the charge sharing circuits 402 to 403 in FIGS. 7A-7C. Therefore, repetitious description is omitted here.

In mode D, the switches SP1, SN3, SP7, and SN5 are kept off, and the switches SP2, SN4, SN6, and SP8 are also kept off.

Continuing to refer to FIGS. 7A-7C, before time T1 (the output stage of the output stage circuit), the switches SP3, SP4, SN1, SN2, SP7, SP8, SN5, and SN6 are turned on. The output stage circuit OP1 outputs the positive polarity voltage to the output channel OUT2; the output stage circuit OP2 outputs the negative polarity voltage to the output channel OUT1; the output stage circuit OP3 outputs the positive polarity voltage to the output channel OUT4; and the output stage circuit OP4 outputs the negative polarity voltage to the output channel OUT3. The charge sharing circuits 404-405 are turned off. That is, the switches SC5-SC8 are turned off.

Then, between times T1 and T2 (charge sharing phase, HI-Z), the gate signals of switches SP3, SN1, SP5, and SN7 are inverted, so that these switches are turned off. At the same time, the gate signals of the switches SC5-SC8 are inverted so that these switches are turned on, thereby providing charge sharing between the output channel OUT1 and the output channel OUT4 and charge sharing between the output channel OUT2 and the output channel OUT3 separately.

As shown in FIGS. 7B-7C, the driving circuit 400 continues to switch between the output stage of the output stage circuit and the charge sharing stage HI-Z in mode D. For example, time T2 to time T3 are the output stage of the output stage circuit, time T3 to time T4 is the charge sharing stage HI-Z, and after time T4 is the output stage of the output stage circuit. Therefore, the relevant descriptions are not repeated here.

The configurations of FIGS. 4A-7C are given for illustrative purposes. The various implementations of FIGS. 4A-7C are within the contemplation of an embodiment of the present invention.

Figure 8:
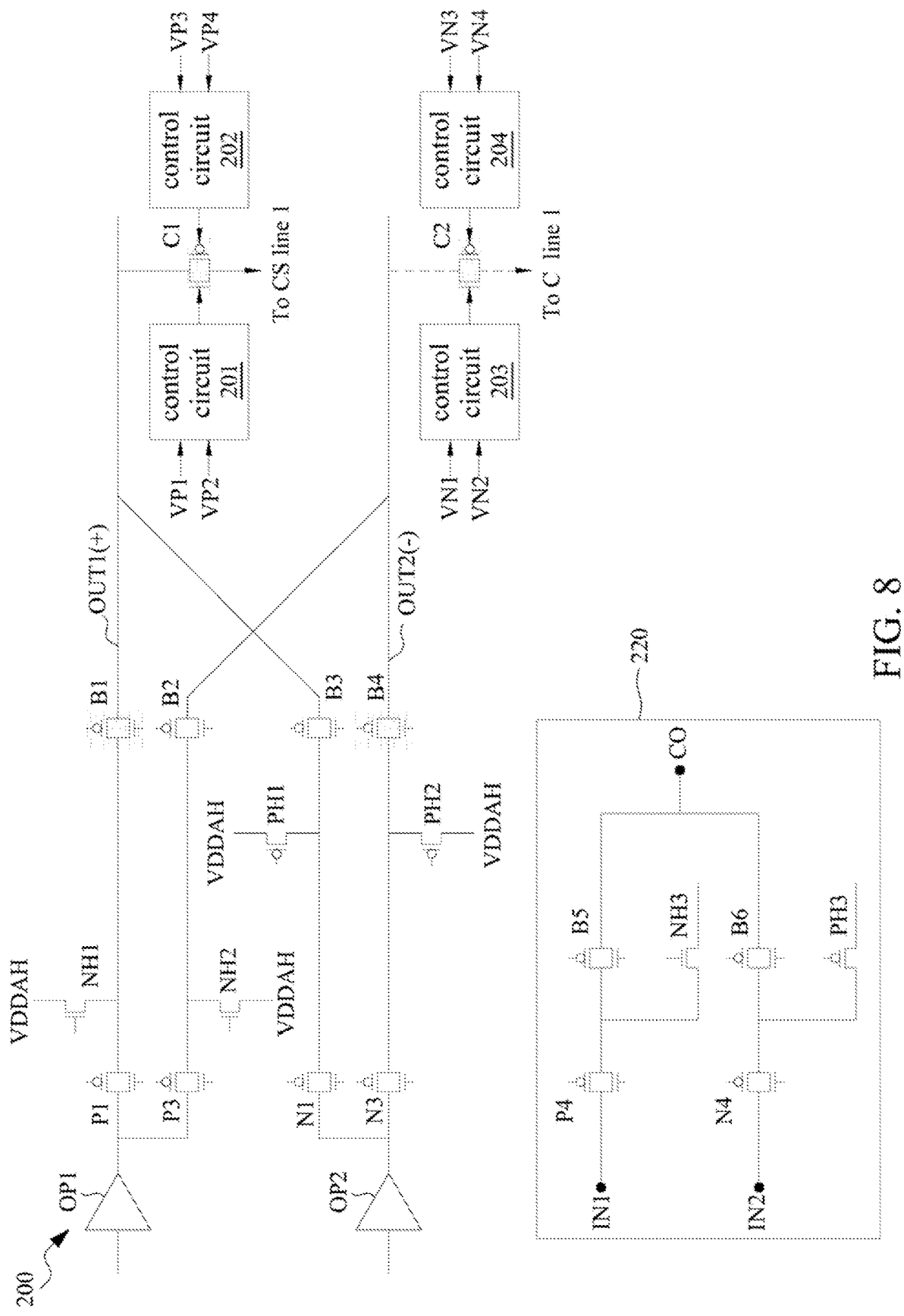
FIG. 8 is a schematic diagram of a driving circuit, in accordance with an embodiment of the present disclosure.

Reference is now made to FIG. 8. FIG. 8 is a schematic diagram of a driving circuit 200, in accordance with an embodiment of the present disclosure. In some embodiments, the driving circuit 200 is configured with respect to, for example, the driving circuit 100. The operation of switching the polarities of the output voltages of the two output channels will be described below by taking the driving circuit 200 as an example. For instance, the output channel OUT1 originally outputs a voltage of positive polarity, while the output channel OUT2 originally outputs a voltage of negative polarity. After the switching operation, the output channel OUT1 outputs a voltage of negative polarity, and the output channel OUT2 outputs a voltage of positive polarity.

As shown in FIG. 8, the output stage circuit OP1 is coupled to the switches P1 and P3. The switches P1 and P3 are respectively coupled to the switches B1 and B2. The switch NH1 is coupled between the switches P1 and B1 for receiving the half voltage VDDAH. The switch NH2 is coupled between the switches P3 and B2 for receiving the half voltage VDDAH. The switch B1 is coupled to the output channel OUT1, and the switch B2 is coupled to the output channel OUT2. Similarly, the output stage circuit OP2 is coupled to the switches N1 and N3. The switches N1 and N3 are respectively coupled to the switches B3 and B4. The switch PH1 is coupled between the switches N1 and B3 for receiving the half voltage VDDAH. The switch PH2 is coupled between the switches N3 and B4 for receiving the half voltage VDDAH. The switch B3 is coupled to the output channel OUT1, and the switch B4 is coupled to the output channel OUT2. The switch C1 is included in a charge sharing circuit corresponding to the charge sharing circuit 102 configured in FIG. 1, and operates in response to the output signals of the control circuits 201-202. The switch C2 is included in a charge sharing circuit corresponding to the charge sharing circuit 104 configured in FIG. 1, and operates in response to the output signals of the control circuits 203-204.

In some embodiments, the control circuits 201-204 are configured with respect to, for example, the control circuit 220. As shown in FIG. 8, the control circuit 220 includes switches P4, N4, B5-B6, NH3, and PH3. The switches P4 and N4 are respectively configured to receive signals at the input terminals IN1-IN2. The switch P4 is coupled to the switches B5 and NH3. The switch N4 is coupled to the switches B6 and PH3. The switch B5 is coupled to the switch B6 at the output terminal CO. In some embodiments, the control circuit 201 is configured to receive the input signals VP1 and VP2, and the control circuit 202 is configured to receive the input signals VP3 and VP4, and outputs the signals to the NMOS and PMOS of the switch C1, respectively. The control circuit 203 is configured to receive the input signals VN1 and VN2, and the control circuit 204 is configured to receive the input signals VN3 and VN4, and respectively outputs the signals to the NMOS and the PMOS of the switch C2.

Figure 9B:
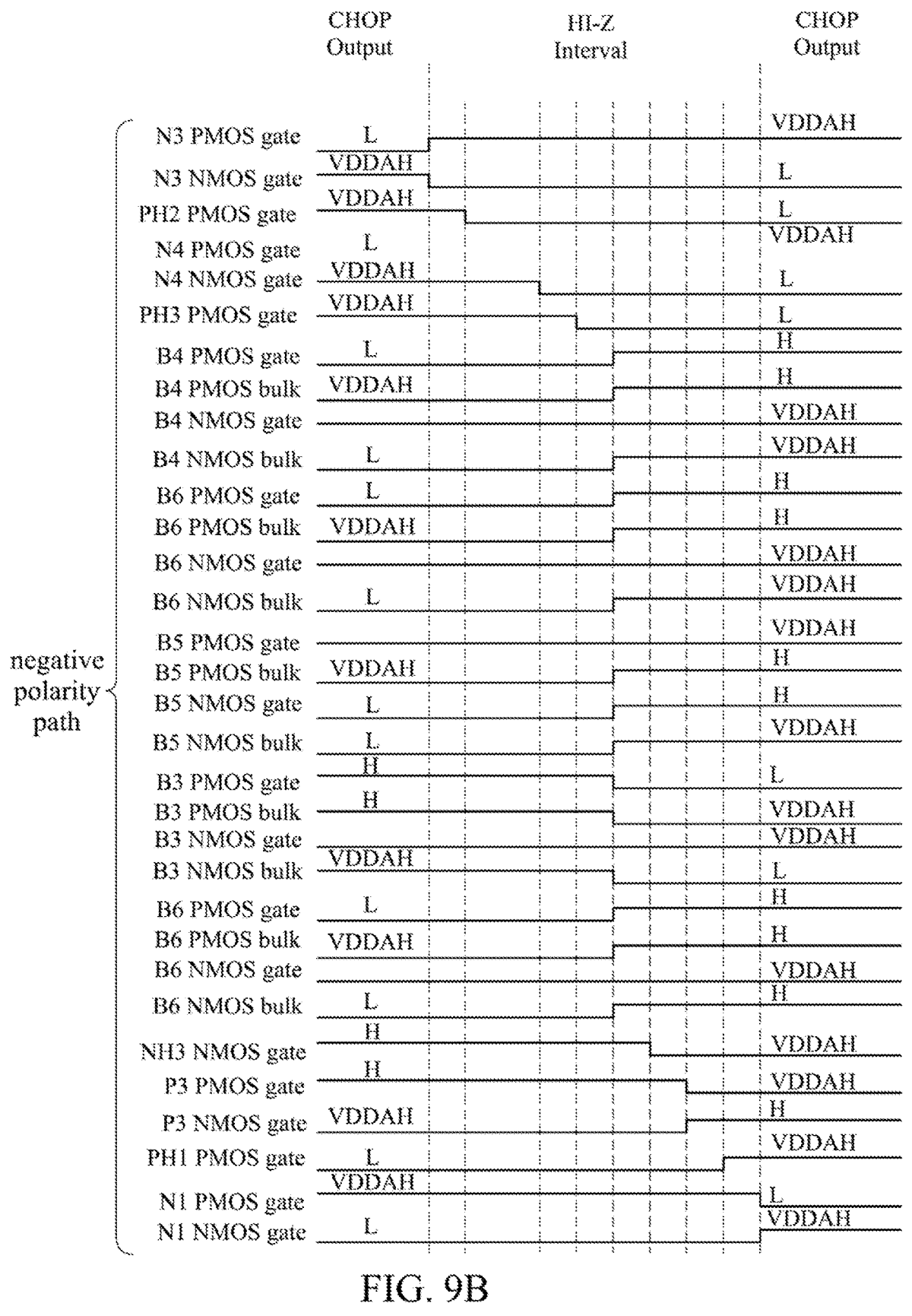

Reference is now made to FIG. 8 and FIGS. 9A-9B at the same time. FIGS. 9A-9B are schematic diagrams of control signals in the driving circuit correspondingly as shown in FIG. 8, in accordance with an embodiment of the present disclosure, respectively showing the control signals in the driving circuit 200 when the polarities of the output channel OUT1 and the output channel OUT2 are switched. For example, in some embodiments, the output channel OUT1 originally receives a voltage of positive polarity from the output stage circuit OP1, and the output channel OUT2 originally receives a voltage of negative polarity from the output stage circuit OP2. Through the operation of the driving circuit 200 shown in FIGS. 8 and 9A-9B, the voltage of the positive polarity of the output stage circuit OP1 is output to the output channel OUT2, and the voltage of the negative polarity of the output stage circuit OP2 is output to the output channel OUT1.

Before time T1 (the output stage of the output stage circuit), the switch P1 is turned on to transmit a voltage of positive polarity to the output channel OUT1, and the gate signal of the PMOS of the switch P1 has a half voltage VDDAH.

At time T1, the switch P1 is turned off, the gate signal of the PMOS of the switch P1 rises from the half voltage VDDAH to a high potential H, and the gate signal of the NMOS of the switch P1 drops to the half voltage VDDAH.

At time T2, the switch NH1 is turned on, and the gate signal thereof rises from the half voltage VDDAH to the high potential H.

At time T3, the switch P4 in the control circuits 201-204 is turned off, the gate signal of the PMOS of the switch P4 rises from the half voltage VDDAH to the high potential H, and the gate signal of the NMOS of the switch P4 drops to the half voltage VDDAH.

At time T4, the switch NH3 is turned on, and the gate signal of the switch NH3 rises from the half voltage VDDAH to the high potential H.

At time T5, the switches B1-B4 switch states, and the base voltages of the PMOS and NMOS of the switches B1-B4 also reverse. For example, the base voltage of the NMOS in the switch B1 drops from the half voltage VDDAH to the low potential L, the base voltages of the PMOS in the switches B2 and B3 drop from the high potential H to the half voltage VDDAH, and the base voltage of the NMOS in the switch B4 rises from the low potential L to the half voltage VDDAH and the base voltage of the PMOS in the switch B4 rises from the half voltage VDDAH to the high potential H. The switches B6 in the control circuits 201-204 are switched to on, and the base voltage of the PMOS thereof drops from the high potential H to the half voltage voltage VDDAH, and the base voltage of the NMOS thereof drops from the half voltage VDDAH to the low potential L. At time T6, the switch PH3 is switched off, and the gate signal thereof rises from the low potential L to the half voltage VDDAH. At time T7, the gate signal of the PMOS of the switches N4 in the control circuits 201-204 drops to the half voltage VDDAH and the gate signal of the NMOS thereof rises to a high potential H.

At time T8, the gate signal of the switch NH2 drops to the half voltage VDDAH.

At time T9, the switch P3 is turned on, and the gate signal of its PMOS drops to the half voltage VDDAH and the gate signal of its NMOS rises to the high potential H.

Then, after the above configurations, after the time T9, the voltage of positive polarity from the output stage circuit OP1 is output to the output channel OUT2.

The configurations of the negative polarity path as shown in FIG. 9B are similar to the configurations of the positive polarity path described above. Therefore, repetitious description is omitted here.

Figure 10A:
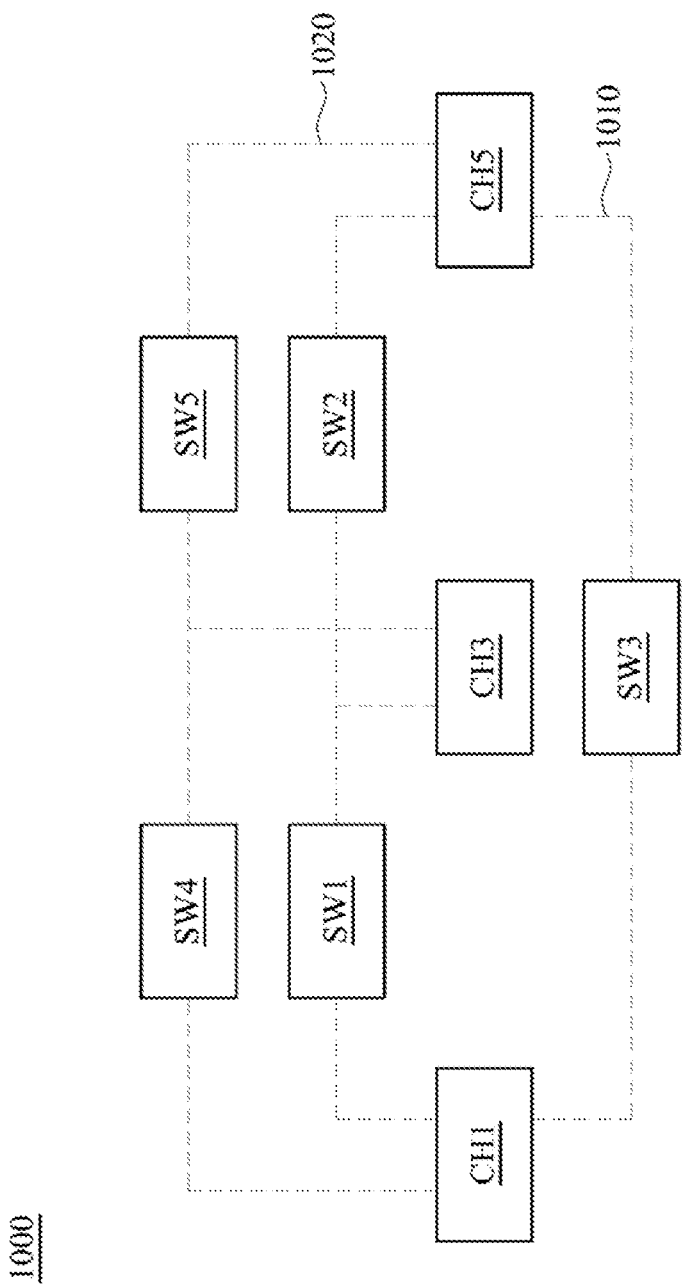
FIG. 10A is a schematic diagram of a driving circuit, in accordance with an embodiment of the present disclosure.

Reference is now made to FIG. 10A. FIG. 10A is a schematic diagram of a driving circuit 1000, in accordance with an embodiment of the present disclosure. As shown in FIG. 10A, the driving circuit 1000 includes charge sharing circuits 1010 and 1020. The charge sharing circuit 1010 includes switches SW1-SW3, and the charge sharing circuit 1020 includes switches SW4-SW5. In some embodiments, the driving circuit 1000 can selectively turn on or turn off the switches in the charge sharing circuits 1010 and 1020 by using an appropriate control signal to select some of the multiple output channels for charge sharing. The configurations of the charge sharing circuits 1010 and 1020 will be described below with reference to FIGS. 10A-10B.

Figure 10B:
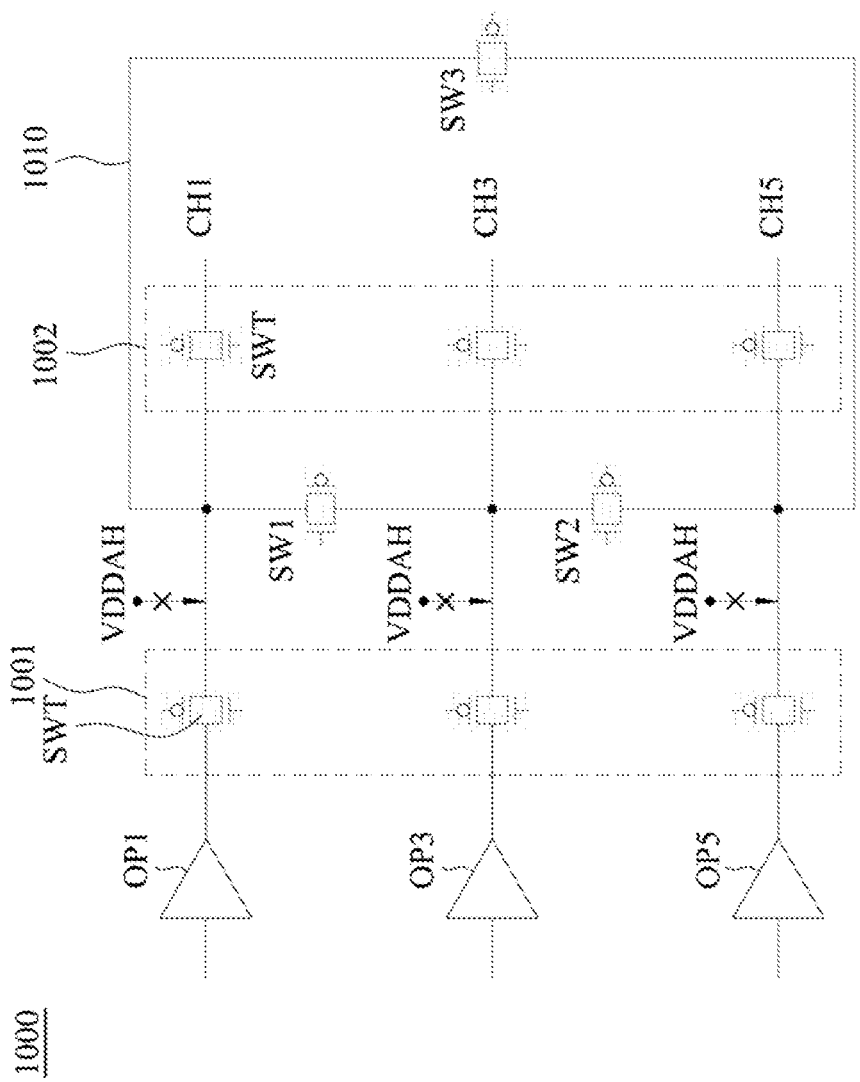
FIG. 10B is a schematic diagram of a driving circuit correspondingly as shown in FIG. 10A, in accordance with an embodiment of the present disclosure.

Reference is now made to FIG. 10B. FIG. 10B is schematic diagram of control signals in the driving circuit 1000 correspondingly as shown in FIG. 10A, in accordance with an embodiment of the present disclosure. As shown in FIG. 10B, the driving circuit 1000 includes output stage circuits OP1, OP3, and OP5, which are selectively turned on through the switching switches SWT in the switching circuits 1001 and 1002 respectively to transmit voltages to the output channels CH1, CH3 and CH5. In some embodiments, the switching switches SWT are configured with respect to, for example, the switches 121, 124, 131, 134 or the switching switches 122, 125, 132, 135 in FIGS. 1 and 2.

The switch SW1 in the charge sharing circuit 1010 is coupled between the output channels CH1 and CH3, the switch SW2 is coupled between the output channels CH3 and CH5, and the switch SW3 is coupled between the output channels CH1 and CH5. In some embodiments, the charge sharing circuit 1010 is selectively turned on to provide charge sharing between the output channels CH1, CH3, and CH5. In some embodiments, the output channels CH1, CH3, CH5 correspond to odd-numbered output channels of the driving circuit 1000. For example, as shown in Table 2 below, when the output polarity inversion signal SQINV has a low logic value and the driving circuit 1000 is controlled and configured to output the same polarity on its odd-numbered output channels (one of positive polarity and negative polarity as described above, and in the same operating voltage range), the charge sharing circuit 1010 is turned on to provide charge sharing between CH1, CH3, and CH5.

TABLE 2

Polarity of output channels CH1-CH6 corresponding to the polarity control signal POL and the output polarity inversion signal SQINV

| mode | SQINV | POL | CH1 | CH2 | CH3 | CH4 | CH5 | CH6 |
|------|-------|-----|-----|-----|-----|-----|-----|-----|
| A    | L     | H   | +   | −   | +   | −   | +   | −   |
| B    |       | L   | −   | +   | −   | +   | −   | +   |
| C    | H     | H   | +   | −   | −   | +   | +   | −   |
| D    |       | L   | −   | +   | +   | −   | −   | +   |

In other embodiments, at least one of the switches SW1-SW3 is turned on to provide charge sharing between the corresponding at least two output channels.

The configurations of FIGS. 10A-10B are given for illustrative purposes. The various implementations of FIGS. 10A-10B are within the contemplation of an embodiment of the present invention. The driving circuit 1000 further includes a circuit similar to the charge sharing circuit 1010 to provide charge sharing among the even-numbered output channels CH2, CH4 and CH6 corresponding to the driving circuit 1000.

Figure 11:
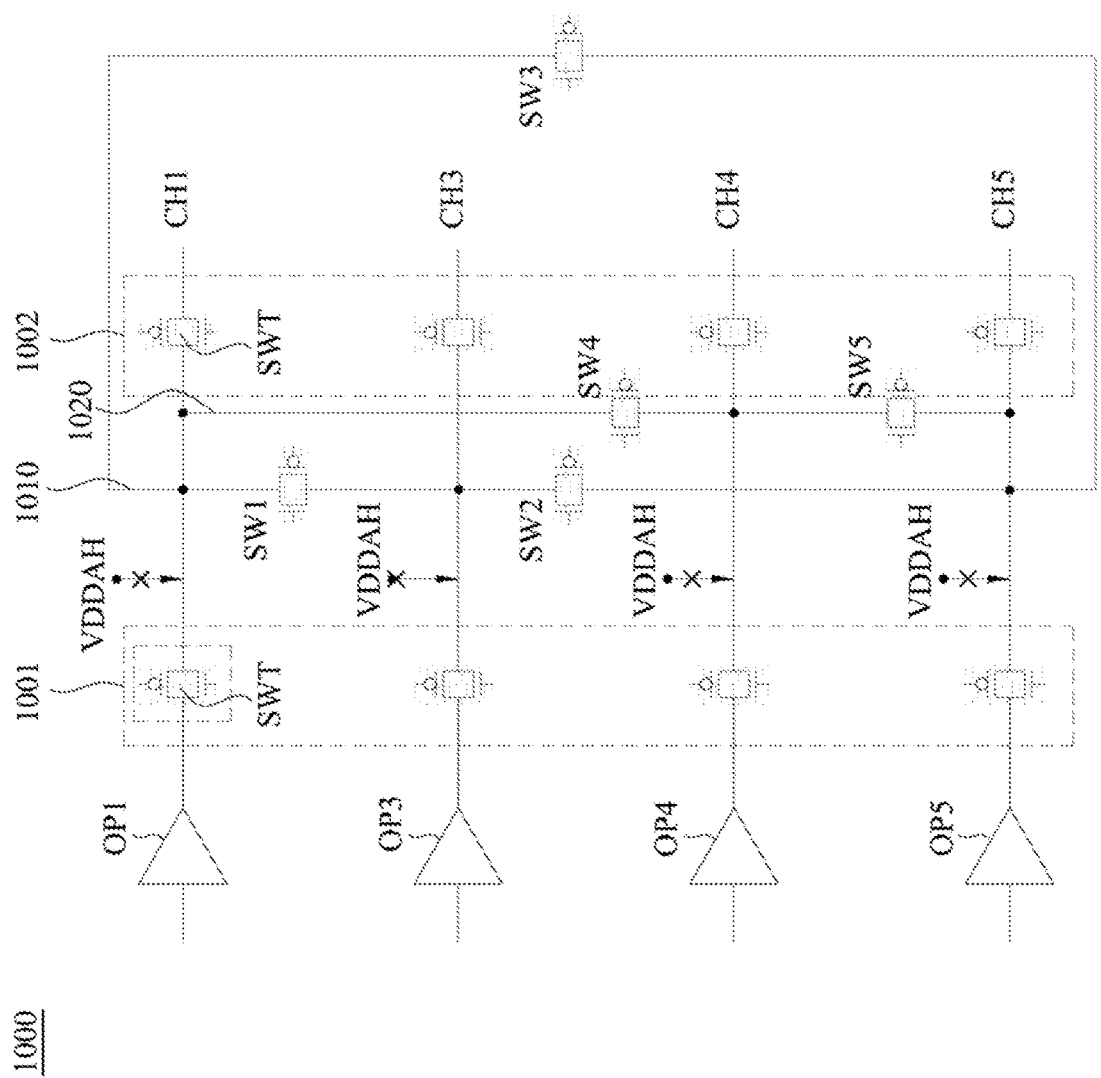
FIG. 11 is a schematic diagram of a driving circuit, in accordance with an embodiment of the present disclosure.

Reference is now made to FIG. 11. FIG. 11 is a schematic diagram of a driving circuit 1000, in accordance with an embodiment of the present disclosure. Compared with FIG. 10B, the driving circuit 1000 further includes an output stage circuit OP4. The output stage circuit OP4 is configured to selectively turn on the switching switches SWT in the switching circuits 1001 and 1002 to transmit the voltage to the output channel CH4.

As shown in FIG. 11, the switch SW4 in the charge sharing circuit 1020 is coupled between the output channels CH1 and CH4, and the switch SW5 is coupled between the output channels CH4 and CH5. In some embodiments, the charge sharing circuit 1020 is selectively turned on to provide charge sharing between the output channels CH1, CH4, and CH5. In some embodiments, output channel CH4 corresponds to one of the even-numbered output channels of driving circuit 1000.

In some embodiments, when the driving circuit 1000 is controlled in response to the output polarity inversion signal SQINV having a high logic (refer to Table 2), the switches SW1 and SW2 in the charge sharing circuit 1010 are turned off, and the charge sharing circuit 1020 is turned on to provide charge sharing between CH1, CH4 and CH5. For example, in the above embodiment, the output channels CH1, CH4, and CH5 output voltages of positive polarity (e.g., the polarity control signal POL has a high logic value), and the output channel CH3 outputs a voltage of the negative polarity different from the positive polarity. It should be noted that, as mentioned above, the positive polarity corresponds to one operating voltage range of the driving circuit 1000, and the negative polarity corresponds to another operating voltage range of the driving circuit 1000.

Figure 12:
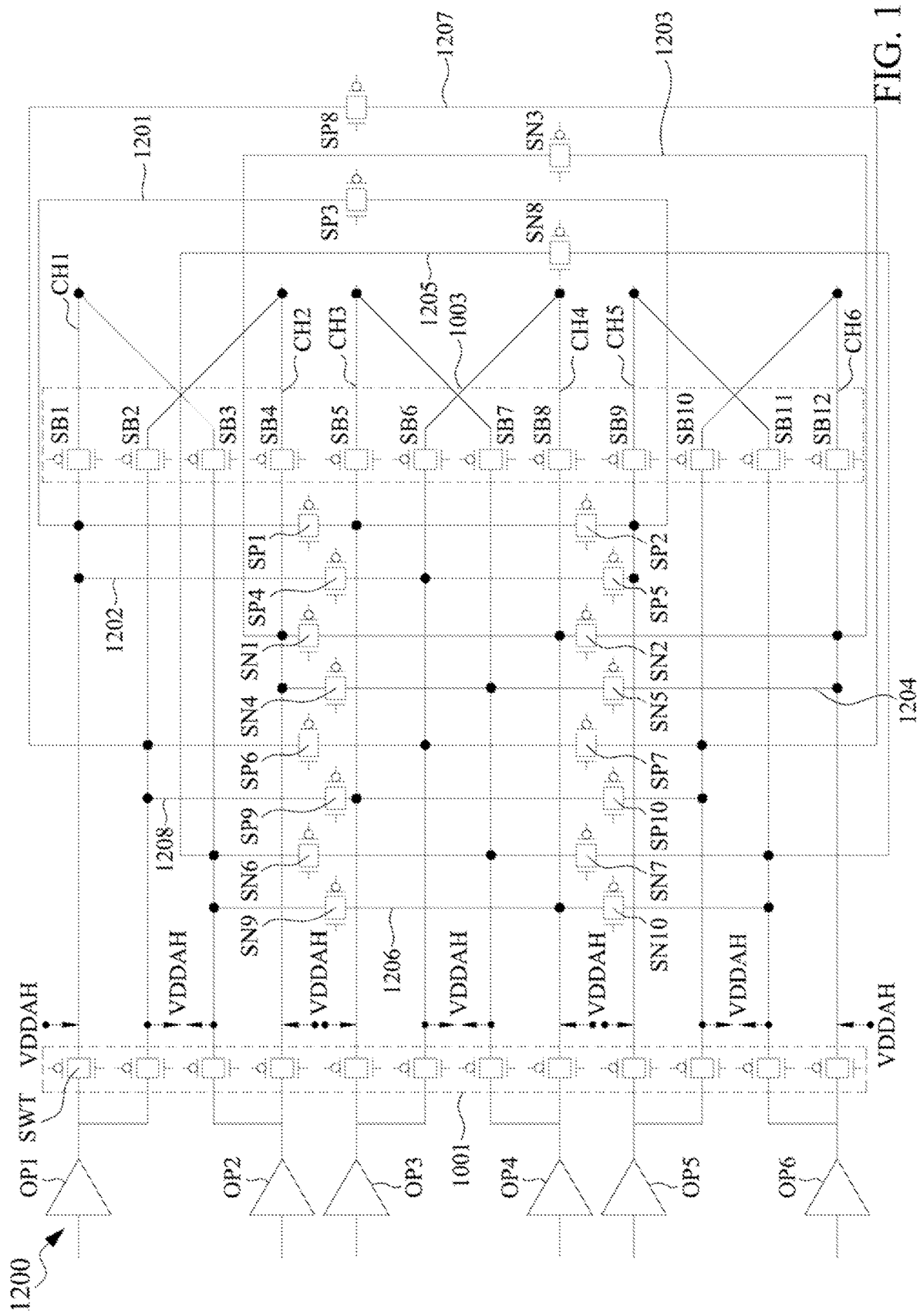
FIG. 12 is a schematic diagram of a driving circuit, in accordance with an embodiment of the present disclosure.

Reference is now made to FIG. 12. FIG. 12 is a schematic diagram of a driving circuit 1200, in accordance with an embodiment of the present disclosure. With respect to the embodiment of FIGS. 1-11, for ease of understanding, like components in FIG. 12 are designated with the same reference numerals.

As shown in FIG. 12, the driving circuit 1200 includes output stage circuits OP1-OP6 for transmitting the voltage to the output channel CH1-CH6 by selectively turning on the switch SWT in the switching circuit 1001 and the switching switches SB1-SB12 in the switching circuit 1003.

The driving circuit 1200 in FIG. 12 includes charge sharing circuits 1201 and 1202. In some embodiments, the charge sharing circuits 1201 and 1202 are configured with respect to, for example, the charge sharing circuits 1010 and 1020 in FIG. 11.

The charge sharing circuit 1201 includes a switch SP1 coupled between the output channels CH1 and CH3 through the switching switches SB1 and SB5 in the switching circuit 1003, a switch SP2 coupled between the output channels CH3 and CH5 through the switching switches SB5 and SB9, and a switch SP3 coupled between the output channels CH1 and CH5.

The charge sharing circuit 1202 includes a switch SP4 coupled between the output channels CH1 and CH4 through the switch switches SB1 and SB6 in the switching circuit 1003, and a switch SP5 coupled between the output channels CH4 and CH5 through the switch switches SB1 and SB9.

The driving circuit 1200 further includes charge sharing circuits 1203 and 1204. The charge sharing circuit 1203 includes a switch SN1 coupled between the output channels CH2 and CH4 through the switch switches SB4 and SB8 in the switching circuit 1003, a switch SN2 coupled between the output channels CH4 and CH6 through the switch switches SB8 and SB12, and a switch SN coupled between the output channels CH2 and CH6 through the switching switches SB4 and SB12.

The charge sharing circuit 1204 includes a switch SN4 coupled between the output channels CH2 and CH3 through the switch switches SB4 and SB7 in the switching circuit

1003, and a switch SN5 coupled between the output channels CH3 and CH6 through the switch switches SB7 and SB12.

The driving circuit 1200 further includes charge sharing circuits 1205 and 1206. The charge sharing circuit 1205 includes a switch SN6 coupled between the output channels CH1 and CH3 through the switch switches SB3 and SB7 in the switching circuit 1003, a switch SN7 coupled between the output channels CH3 and CH5 through the switch switches SB7 and SB11, and a switch SN8 coupled between the output channels CH1 and CH5 through the switching switches SB3 and SB11.

The charge sharing circuit 1206 includes a switch SN9 coupled between the output channels CH1 and CH4 through the switch switches SB3 and SB8 in the switching circuit 1003, and a switch SN10 coupled between the output channels CH4 and CH5 through the switch switches SB8 and SB11.

The driving circuit 1200 further includes charge sharing circuits 1207 and 1208. The charge sharing circuit 1207 includes a switch SP6 which is coupled between the output channels CH2 and CH4 through the switching switches SB2 and SB6 in the switching circuit 1003, a switch SP5 which is coupled between the output channels CH4 and CH5 through the switching switches SB6 and SB9, and a switch SP3 coupled between the output channels CH1 and CH5.

The charge sharing circuit 1208 includes a switch SP9 which is coupled between the output channels CH2 and CH3 through the switching switches SB2 and SB5 in the switching circuit 1003 and a switch SP10 which is coupled between the output channels CH3 and CH5 through the switching switches SB5 and SB9.

Next, four operating embodiments of the driving circuit 1200 corresponding to Table 2 will be described in conjunction with FIGS. 13A-16B. For the sake of brevity, only the switches related to this mode in the driving circuit 1200 are shown in FIGS. 13A, 14A, 15A and 16A, and the remaining switches are omitted.

Figure 13A:
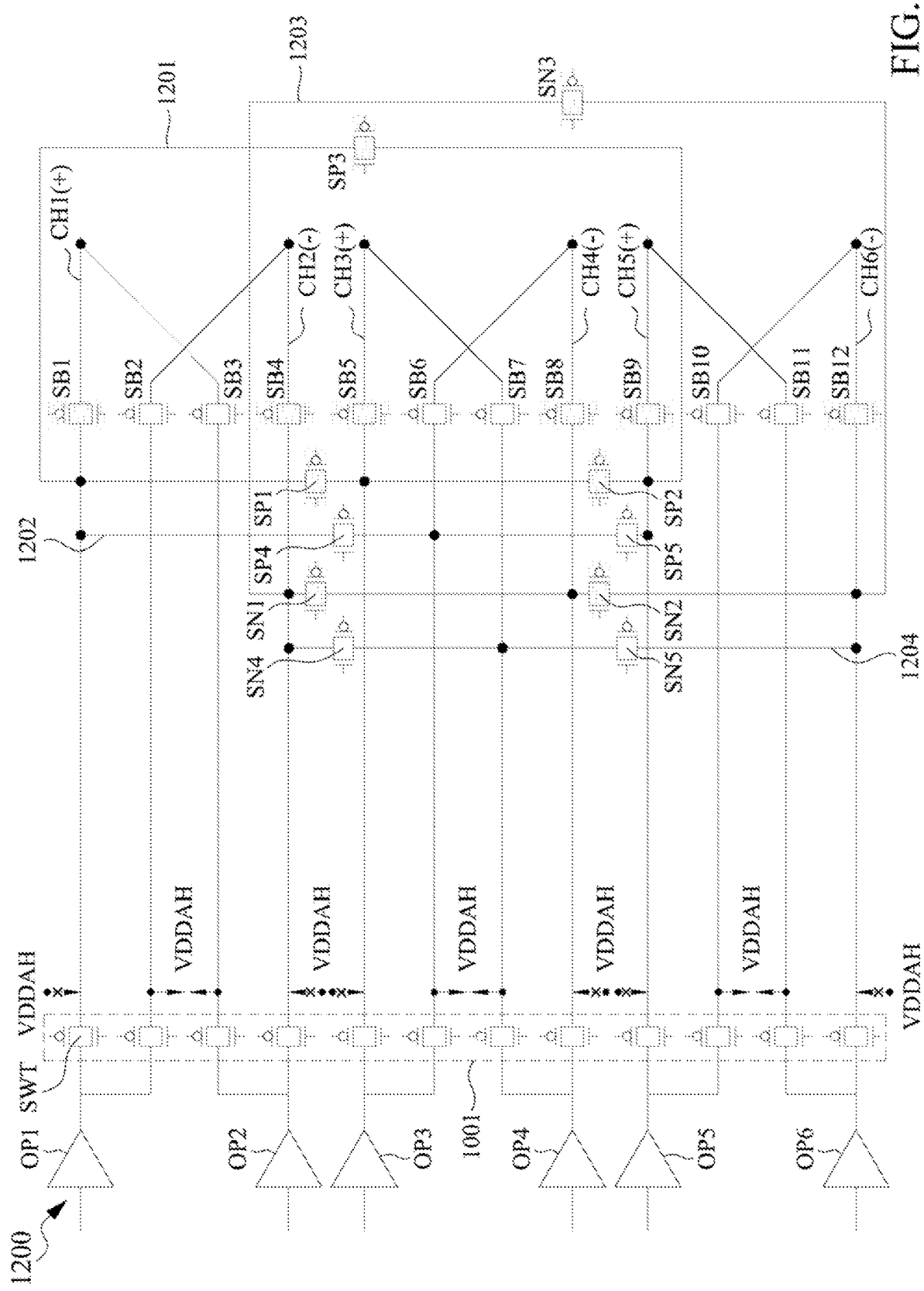
FIG. 13A is a schematic diagram of a driving circuit, in accordance with an embodiment of the present disclosure.
Figure 13B:
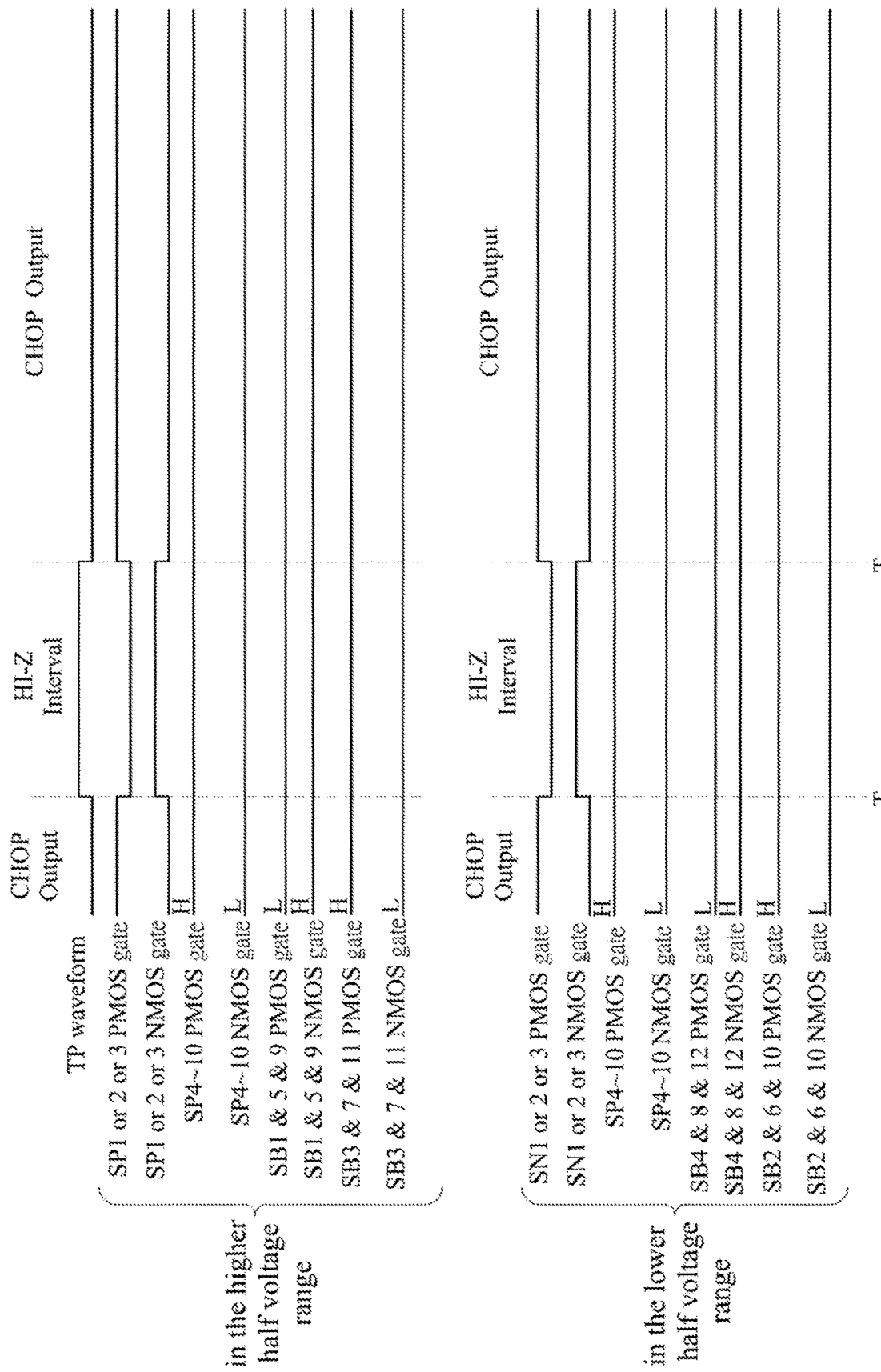
FIG. 13B is a schematic diagram of control signals in the driving circuit correspondingly as shown in FIG. 13A, in accordance with an embodiment of the present disclosure.

Reference is now made to FIGS. 13A-13B. FIG. 13A is a schematic diagram corresponding to the driving circuit 1200 of FIG. 12, in accordance with an embodiment of the present disclosure. FIG. 13B is a schematic diagram corresponding to the control signals in the driving circuit 1200 shown in FIG. 13A, in accordance with an embodiment of the present disclosure. The embodiments in FIGS. 13A-13B correspond to the mode A in which the polarity control signal POL has a high logic value and the output polarity inversion signal SQINV has a low logic value, as shown in Table 2.

In some embodiments, when the output polarity inversion signal SQINV has a low logic value, the output signals of the output channels CH1, CH3, CH5 have the same polarity, and the output signals of the output channels CH2, CH4, CH6 have the same polarity. Therefore, in mode A, the charge sharing circuits 1202, 1204, 1205-1208 are turned off, and alternatively stated, the switches in the charge sharing circuits 1202, 1204, 1205-1208 are turned off (the gate signals of the PMOS have the high logic value (H) and the gate signals of the NMOS have the low logic value (L) as shown in FIG. 13B).

In addition, in mode A, the switching switches SB2, SB3, SB6, SB7, SB10, and SB11 are all kept off; and the switching switches SB1, SB4, SB5, SB8, SB9, and SB12 are all kept on.

Continuing to refer to FIGS. 13A-13B, before time T1 (the output stage of the output stage circuit), the switching switches SWT in the switching circuit 1001 are turned on and the output stage circuits OP1-OP6 output voltages of corresponding polarities to the output channels CH1-CH6. The charge sharing circuits 1201 and 1203 are turned off, and that is, the switches therein are turned off. The output channels CH1, CH3, CH5 output voltages of positive polarity and the output channels CH2, CH4, CH6 output voltages of negative polarity.

Then, between times T1 and T2 (the charge sharing phase, HI-Z), the gate signals of at least one of the switches SP1-SP3 in the charge sharing circuit 1201 are inverted to turn on the at least one of the switches SP1-SP3, so as to provide charge sharing between the output channels that are coupled to the terminals of the at least one of the switches SP1-SP3. For example, in some embodiments, only charge sharing between the output channels CH3 and CH5 is required, so the switches SP1 and SP3 are turned off and the switch SP2 is turned on.

Similarly, between times T1 and T2, the gate signals of at least one of the switches SN1-SN3 in the charge sharing circuit 1203 are inverted to turn on at least one of the switches SN1-SN3, so as to provide charge sharing between the output channels that are coupled to two terminals of the at least one of the switches SN1-SN3. For example, in some embodiments, only charge sharing between the output channels CH2 and CH4 is required, so the switches SN2 and SN3 are turned off and the switch SN1 is turned on.

And after time T2, the driving circuit 1200 switches back to the output stage of the output stage circuit.

Figure 14A:
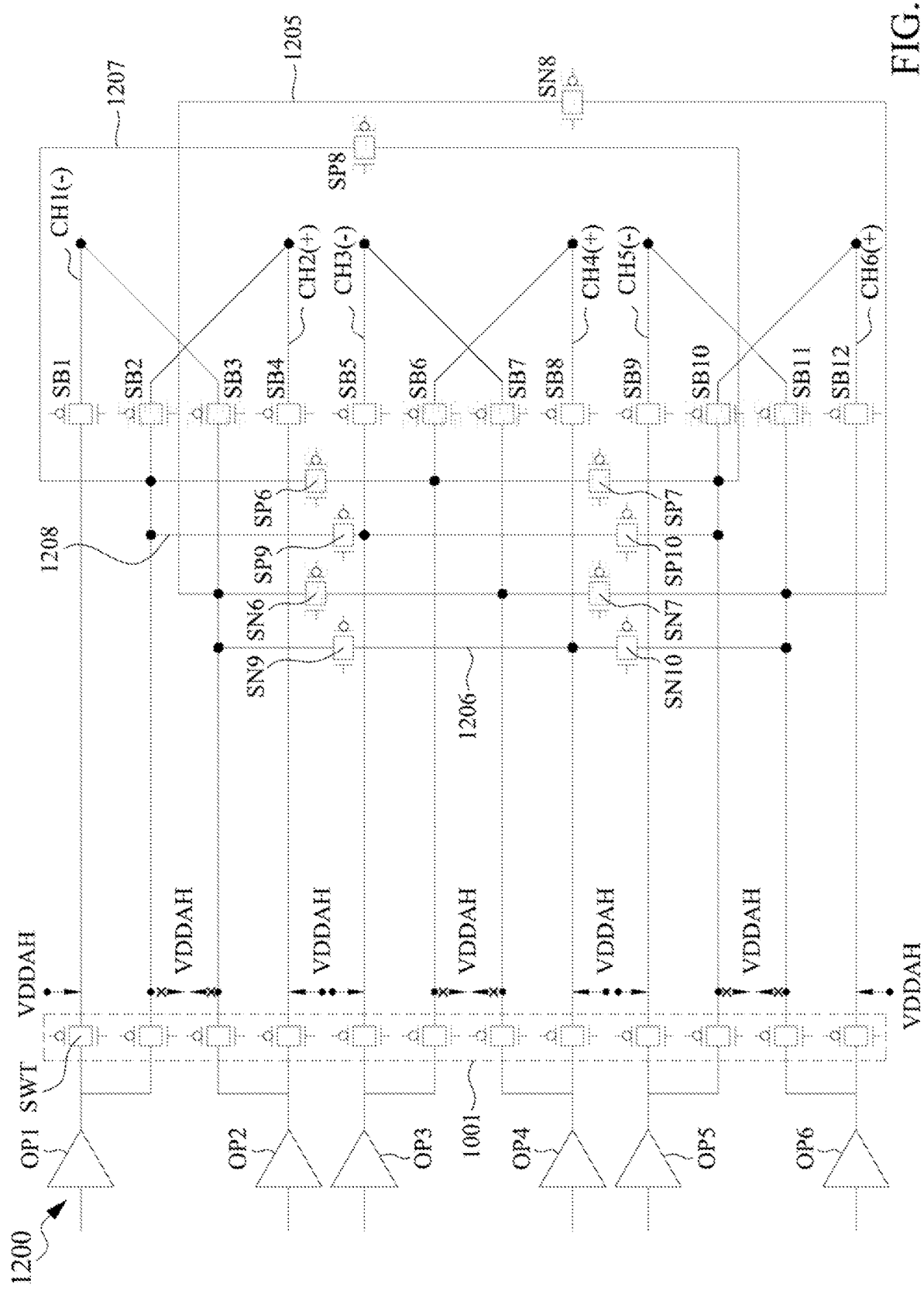
FIG. 14A is a schematic diagram of a driving circuit, in accordance with an embodiment of the present disclosure.
Figure 14B:
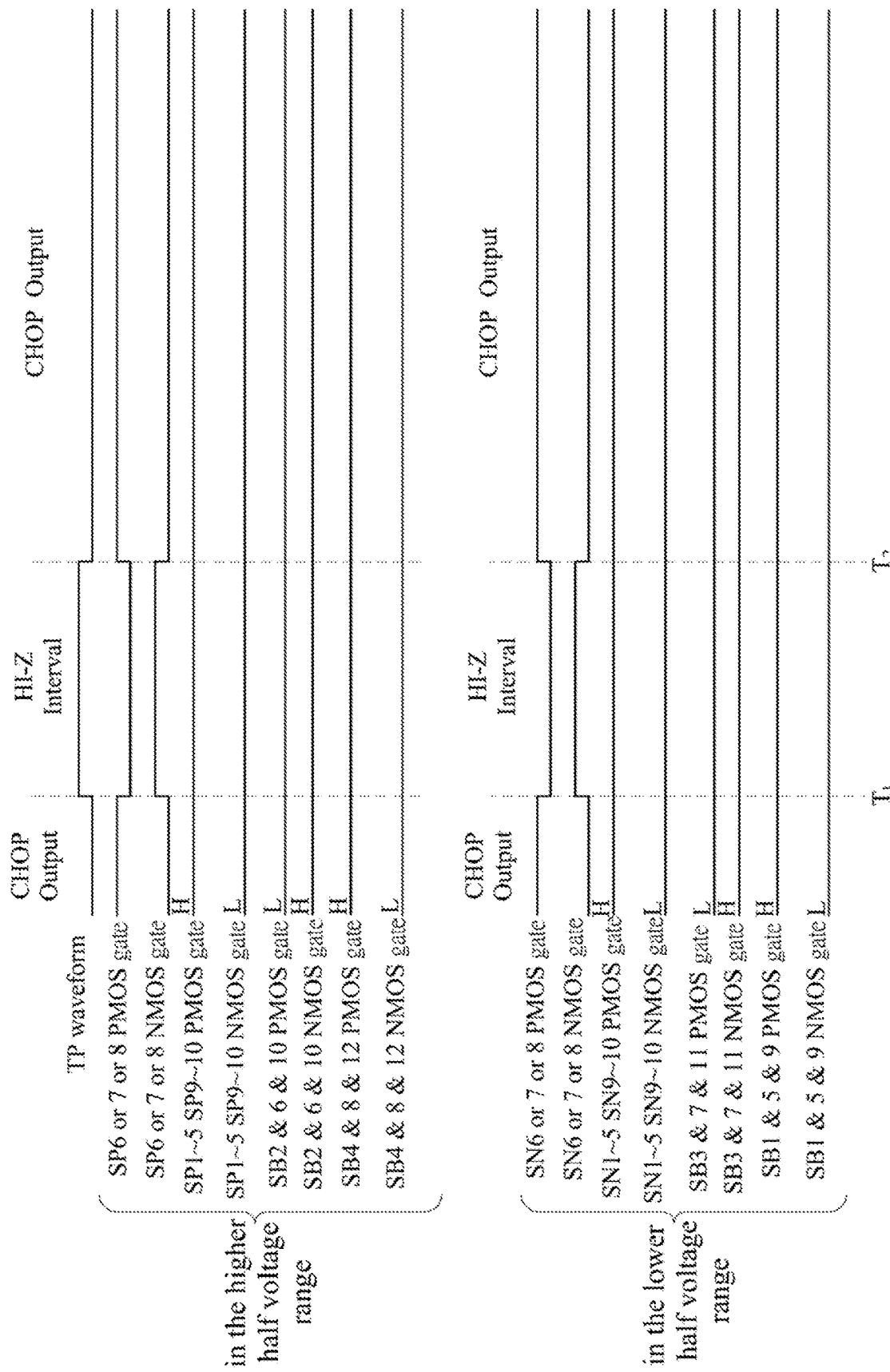
FIG. 14B is a schematic diagram of control signals in the driving circuit correspondingly as shown in FIG. 14A, in accordance with an embodiment of the present disclosure.

Reference is now made to FIGS. 14A-14B. FIG. 14A is a schematic diagram corresponding to the driving circuit 1200 of FIG. 12, in accordance with an embodiment of the present disclosure. FIG. 14B is a schematic diagram corresponding to the control signals in the driving circuit 1200 shown in FIG. 14A, in accordance with an embodiment of the present disclosure. The embodiments in FIGS. 14A-14B correspond to the mode B in which the polarity control signal POL has a low logic value and the output polarity inversion signal SQINV has a low logic value, as shown in Table 2.

In some embodiments, in mode B, the charge sharing circuits 1201-1204, 1206, 1208 remain off. The configurations of the charge sharing circuits 1201-1204, 1206, 1208 in FIGS. 14A-14B are similar to those between the charge sharing circuits 1202, 1204, 1205-1208 in FIGS. 13A-13B. Therefore, repetitious description is omitted here.

In addition, in mode B, the switching switches SB1, SB4, SB5, SB8, SB9, and SB12 are all kept off; and the switches SB2, SB3, SB6, SB7, SB10, and SB11 are all kept on.

Continuing to refer to FIGS. 14A-14B, before time T1 (the output stage of the output stage circuit), the switching switches SWT in the switching circuit 1001 are turned on and the output stage circuits OP1-OP6 output voltages of corresponding polarities to the output channels CH1-CH6. The charge sharing circuits 1205 and 1207 are turned off, and that is, the switches therein are turned off. Compared with the embodiment of FIGS. 13A-13B, the output channels CH1, CH3, and CH5 output voltages of negative polarity and the output channels CH2, CH4, and CH6 output voltages of positive polarity.

Then, between times T1 to T2 (charge sharing phase, HI-Z), the gate signals of at least one of the switches SN6-SN8 in the charge sharing circuit 1205 are inverted to turn on the at least one of the switches SN6-SN8, so as to provide the charge sharing between the output channels that are coupled to two terminals of the at least one of the switches SN6-SN8. For example, in some embodiments, only charge sharing between the output channels CH3 and CH5 is required, so the switches SN6 and SN8 are turned off and the switch SN7 is turned on.

Similarly, between times T1 and T2, the gate signals of at least one of the switches SP6-SP8 in the charge sharing circuit 1207 is inverted to turn on the at least one of the switches SP6-SP8 to provide charge sharing between the output channels that are coupled to two terminals of the at least one of the switches SP6-SP8. For example, in some embodiments, only charge sharing between output channels CH2 and CH4 is required, so switches SP7 and SP8 are turned off and switch SP6 is turned on.

After time T2, the driving circuit 1200 switches back to the output stage of the output stage circuit.

Figure 15A:
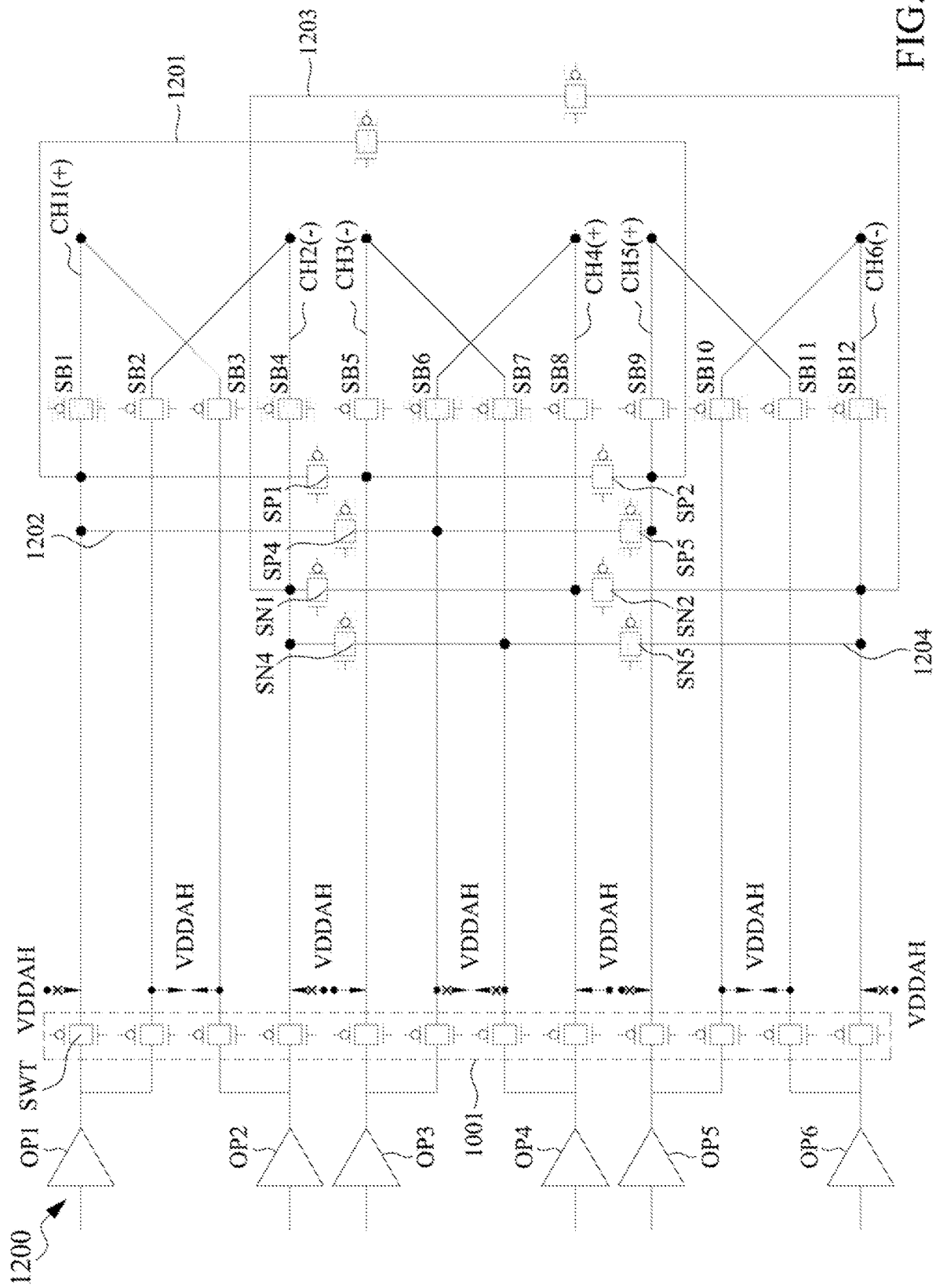
FIG. 15A is a schematic diagram of a driving circuit, in accordance with an embodiment of the present disclosure.
Figure 15B:
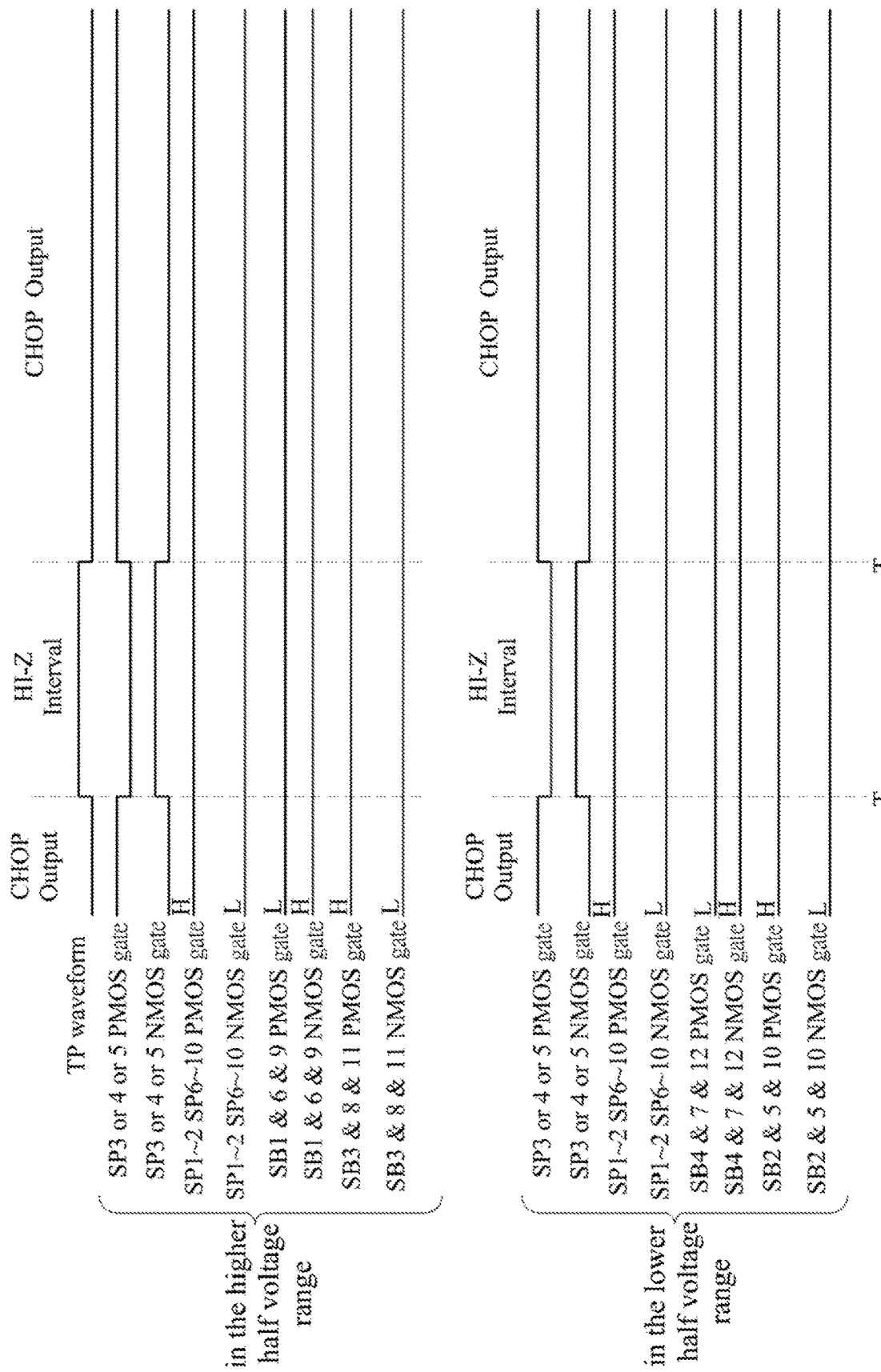
FIG. 15B is a schematic diagram of control signals in the driving circuit correspondingly as shown in FIG. 15A, in accordance with an embodiment of the present disclosure.

Reference is now made to FIGS. 15A-15B. FIG. 15A is a schematic diagram corresponding to the driving circuit 1200 of FIG. 12, in accordance with an embodiment of the present disclosure. FIG. 15B is a schematic diagram corresponding to the control signals in the driving circuit 1200 shown in FIG. 15A, in accordance with an embodiment of the present disclosure. The embodiments in FIGS. 15A-15B correspond to the mode C in which the polarity control signal POL has a high logic value and the output polarity inversion signal SQINV has a high logic value, as shown in Table 2.

In some embodiments, when the output polarity inversion signal SQINV has a high logic value, the output signals of the output channels CH1, CH4-CH5 have the same polarity, and the output signals of the output channels CH2, CH3 and CH6 have the same polarity, as shown in the Table 2. Therefore, in mode C, the charge sharing circuits 1201, 1203, 1205-1208 are turned off, and alternatively stated, the switches in the charge sharing circuits 1201, 1203, 1205-1208 are turned off (the gate signals of the PMOS have the high logic value (H) and the gate signals of the NMOS have the low logic value (L) as shown in FIG. 15B). Meanwhile, in some embodiments, the nodes where the switches in the charge sharing circuits 1201, 1203 are coupled to each other have the half voltage VDDAH as a protection voltage to protect the switches therein from experiencing unexpected cross voltage.

In addition, in mode C, the switching switches SB2, SB3, SB5, SB8, SB10, and SB11 are all kept off; and the switching switches SB1, SB4, SB6, SB7, SB9, and SB12 are all kept on.

Continuing to refer to FIGS. 15A-15B, before time T1 (the output stage of the output stage circuit), the switching switches SWT in the switching circuit 1001 are turned on and the output stage circuits OP1-OP6 output voltages of corresponding polarities to the output channels CH1-CH6. For illustration, the output channels CH1, CH4, and CH5 output voltages of positive polarity and the output channels CH2, CH3, and CH6 output voltages of negative polarity. The charge sharing circuits 1202 and 1204 are turned off, and that is, the switches therein are turned off.

Then, between times T1 and T2 (the charge sharing stage, HI-Z), the gate signals of at least one of the switches SP4 and SP5 in the charge sharing circuit 1202 and the switch SP3 of the charge sharing circuit 1201 are inverted to turn on corresponding switch to provide charge sharing between the output channels that are coupled to two terminals of the switch. For example, in some embodiments, when charge sharing between the output channels CH1, CH4 and CH5 is required, all of the switches SP3 to SP5 are turned on.

Similarly, between the times T1 and T2, the gate signals of at least one of the switches SN4 and SN5 in the charge sharing circuit 1204 and the switch SN3 in the charge sharing circuit 1203 are inverted to turn on corresponding switch to provide charge sharing between the output channels that are coupled to two terminals of the switch. For example, in some embodiments, when charge sharing between the output channels CH2, CH3 and CH6 is required, all of the switches SN3-SN5 are turned on.

After time T2, the driving circuit 1200 switches back to the output stage of the output stage circuit.

Figure 16A:
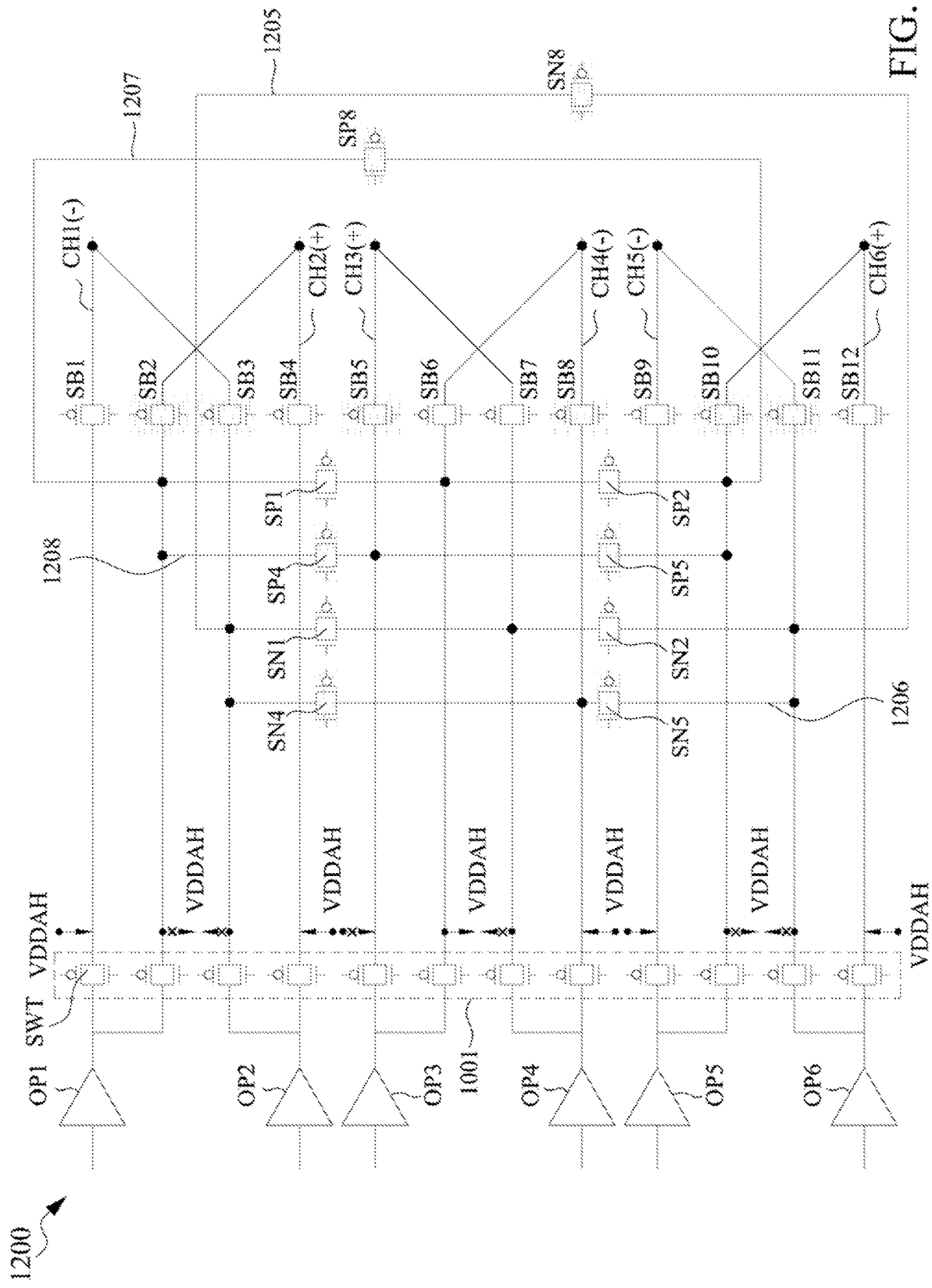
FIG. 16A is a schematic diagram of a driving circuit, in accordance with an embodiment of the present disclosure.
Figure 16B:
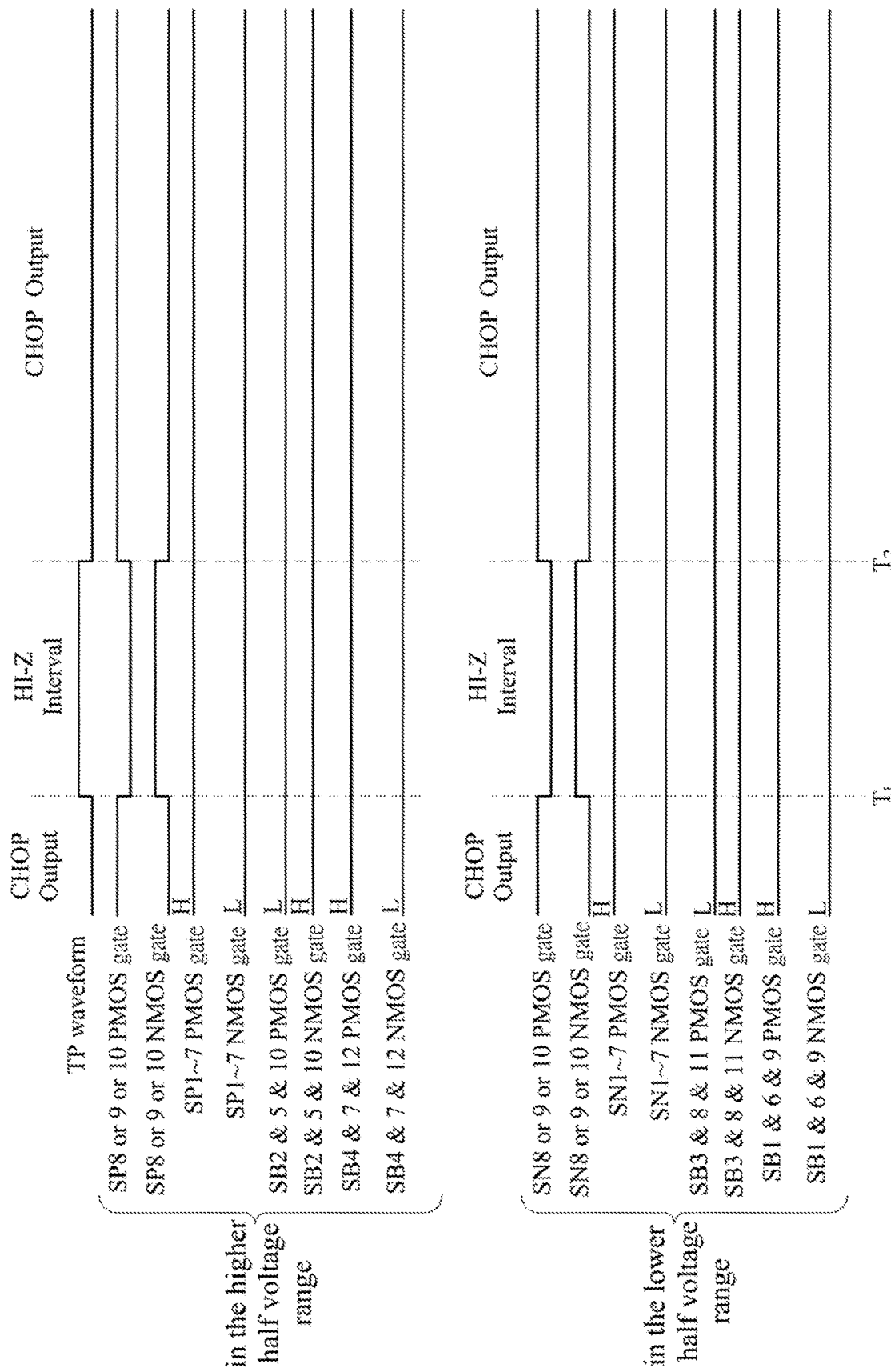
FIG. 16B is a schematic diagram of control signals in the driving circuit correspondingly as shown in FIG. 16A, in accordance with an embodiment of the present disclosure.

Reference is now made to FIGS. 16A-16B. FIG. 16A is a schematic diagram corresponding to the driving circuit 1200 of FIG. 12, in accordance with an embodiment of the present disclosure. FIG. 16B is a schematic diagram corresponding to the control signals in the driving circuit 1200 shown in FIG. 16A, in accordance with an embodiment of the present disclosure. The embodiments in FIGS. 16A-16B correspond to the mode D in which the polarity control signal POL has a low logic value and the output polarity inversion signal SQINV has a high logic value, as shown in Table 2.

In some embodiments, in mode D, some of the charge sharing circuits 1201-1204, 1205 and 1207 are turned off, and alternatively stated, some of the switches in the charge sharing circuits 1201-1204, 1205 and 1207 are turned off (the gate signals of PMOS have high logic value (H) and the gate signals of NMOS is low potential (L), as shown in FIG. 16B). Meanwhile, in some embodiments, the nodes in the charge sharing circuits 1205, 1207 where the switches are coupled to each other have the half voltage VDDAH as a protection voltage to protect the switches therein from experiencing unexpected cross voltages.

In addition, in mode D, the switches SB1, SB4, SB6, SB7, SB9, and SB12 are all kept off; and the switches SB2, SB3, SB5, SB8, SB10, and SB11 are all kept on.

Continuing to refer to FIGS. 16A-16B, before time T1 (the output stage of the output stage circuit), the switching switches SWT in the switching circuit 1001 are turned on and the output stage circuits OP1-OP6 output voltages of corresponding polarities to the output channels CH1-CH6. For illustration, the output channels CH1, CH4, and CH5 output voltages of negative polarity and the output channels CH2, CH3, and CH6 output voltages of positive polarity. The charge sharing circuits 1206 and 1208 are turned off, and that is, the switches therein are turned off.

Then, in the middle of time T1 to T2 (charge sharing stage, HI-Z), the gate signal of at least one of the switches SN9 and SN10 of the charge sharing circuit 1206 and the switch SN8 of the charge sharing circuit 1205 is inverted to turn on., to provide charge sharing for the output channels coupled across the switch. For example, in some embodiments, if charge sharing among the output channels CH1, CH4 and CH5 is required, the switches SN8 to SN10 are all turned on.

Similarly, between times T1 and T2, the gate signals of at least one of the switches SP9, SP10 of the charge sharing circuit 1208 and the switch SP8 of the charge sharing circuit 1207 are inverted to turn on corresponding switch to provide charge sharing between the output channels that are coupled to two terminals of the switch. For example, in some embodiments, when charge sharing between the output channels CH3 and CH6 is required, the switch SP10 is turned on and the switches SP8-SP9 are turned off.

After time T2, the driving circuit 1200 switches back to the output stage of the output stage circuit.

With the above-mentioned configurations provided by the present disclosure, the driving circuits 1000 and 1200 can flexibly select output channels that require charge sharing, thereby improving the operational flexibility of the driving circuits and further reducing power consumption.

Based on the above, the driving circuit proposed in the present disclosure utilizes the associated configurations of the charge sharing paths to reduce the power consumption of the output channels during charge sharing, and provides configurations for selecting the output channels that need to be shared, thus reducing the power consumption of the circuit and improving the operation speed, which improves driving circuit performance.

While the disclosure has been described by way of example(s) and in terms of the preferred embodiment(s), it is to be understood that the disclosure is not limited thereto. Those skilled in the art may make various changes, substitutions, and alterations herein without departing from the spirit and scope of the present disclosure. In view of the foregoing, it is intended that the present invention cover modifications and variations of this invention provided they fall within the scope of the following claims.

What is claimed is:

1. A driving circuit, comprising:
a first output stage circuit and a second output stage circuit, wherein the first output stage circuit is configured to output a first voltage of a first polarity, and the second output stage circuit is configured to output a second voltage, different from the first voltage of the first polarity;
a first switch having a first terminal receiving the first voltage from the first output stage circuit and a second terminal coupled to a first output channel through a switching circuit;
a second switch having a first terminal receiving the second voltage from the second output stage circuit and a second terminal coupled to a second output channel through the switching circuit;
a first charge sharing circuit having a first terminal coupled to the first output channel and a second terminal coupled to the second output channel;
a third output stage circuit and a fourth output stage circuit, wherein the third output stage circuit is configured to output a third voltage of a second polarity, and the fourth output stage circuit is configured to output a fourth voltage, different from the third voltage, of the second polarity, wherein the second polarity is different from the first polarity;
a third switch having a first terminal receiving the third voltage from the third output stage circuit and a second terminal coupled to a third output channel through the switching circuit;
a fourth switch having a first terminal receiving the fourth voltage from the fourth output stage circuit and a second terminal coupled to a fourth output channel through the switching circuit;
a second charge sharing circuit having a first terminal coupled to the third output channel and a second terminal coupled to the fourth output channel;
a third charge sharing circuit having a first terminal coupled to the first output channel and a second terminal coupled to the fourth output channel; and
a fourth charge sharing circuit having a first terminal coupled to the second output channel and a second terminal coupled to the third output channel;
wherein the first charge sharing circuit is configured to be turned on to provide charge sharing between the first output channel and the second output channel;
wherein the second charge sharing circuit is configured to be turned on to provide charge sharing between the third output channel and the fourth output channel;
wherein the switching circuit comprises:
a first switching switch having a first terminal receiving the second voltage from the second output stage circuit and a second terminal coupled to the fourth output channel, wherein the first switching switch is configured to provide the second voltage to the fourth output channel; and
a second switching switch having a first terminal receiving the fourth voltage from the fourth output stage circuit and a second terminal coupled to the second output channel, wherein the second switching switch is configured to provide the four voltage to the second output channel.

2. The driving circuit of claim 1, wherein when the first charge sharing circuit is turned off, the first switch is configured to provide the first voltage to the first output channel, and the second switch is configured to provide the second voltage to the second output channel.

3. The driving circuit of claim 1, wherein when the first charge sharing circuit is turned on, the first switch and the second switch are turned off.

4. The driving circuit of claim 1, wherein the first polarity corresponds to a first operating voltage interval, and the second polarity corresponds to a second operating voltage interval lower than the first operating voltage interval.

5. The driving circuit of claim 1, wherein the third charge sharing circuit is configured to be turned on to provide charge sharing between the first output channel and the fourth output channel, and
the fourth charge sharing circuit is configured to be turned on to provide charge sharing between the second output channel and the third output channel.

6. The driving circuit of claim 1, wherein when the first charge sharing circuit and the second charge sharing circuit are turned off, the first charge sharing circuit comprises:
a fifth switch coupled to the first output channel; and
a sixth switch that is coupled to the second output channel and coupled to the first switch at a node,
wherein the node has a protection voltage corresponding to half of the sum of the first voltage and the fourth voltage.

7. The driving circuit of claim 1, wherein the first output channel and the second output channel correspond to odd-numbered output channels of the driving circuit, and the third output channel and the fourth output channel correspond to even-numbered output channels of the driving circuit.

* * * * *